(12) United States Patent
Shimizu

(10) Patent No.: US 12,191,356 B2
(45) Date of Patent: Jan. 7, 2025

(54) SEMICONDUCTOR DEVICE INCLUDING SILICON CARBIDE REGION CONTAINING OXYGEN

(71) Applicant: KABUSHIKI KAISHA TOSHIBA, Tokyo (JP)

(72) Inventor: Tatsuo Shimizu, Shinagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 617 days.

(21) Appl. No.: 17/447,074

(22) Filed: Sep. 8, 2021

(65) Prior Publication Data

US 2022/0310791 A1 Sep. 29, 2022

(30) Foreign Application Priority Data

Mar. 23, 2021 (JP) .................. 2021-048710

(51) Int. Cl.
 *H01L 29/10* (2006.01)
 *B60L 53/20* (2019.01)
 (Continued)

(52) U.S. Cl.
 CPC .......... *H01L 29/1045* (2013.01); *B60L 53/20* (2019.02); *H01L 29/167* (2013.01); *H01L 29/66068* (2013.01); *H01L 29/7813* (2013.01); *B66B 11/043* (2013.01); *H01L 21/045* (2013.01); *H01L 29/045* (2013.01);
 (Continued)

(58) Field of Classification Search
 CPC ............... H01L 29/1045; H01L 29/164; H01L 29/66068; H01L 29/7813; H01L 29/045; H01L 29/1608; H01L 29/0623; H01L 29/0696; H01L 29/1033; H01L 29/1095; H01L 29/7825; H01L 29/4236
 See application file for complete search history.

(56) References Cited

U.S. PATENT DOCUMENTS

| 10,177,251 B2 * | 1/2019 | Shimizu ................ H01L 29/872 |
| 10,276,666 B2 | 4/2019 | Hoshi et al. |
| 2015/0048382 A1 * | 2/2015 | Takeuchi .......... H01L 29/66068 257/77 |

(Continued)

FOREIGN PATENT DOCUMENTS

| JP | 2013-98415 A | 5/2013 |
| JP | 2013-105890 A | 5/2013 |

(Continued)

*Primary Examiner* — Ida M Soward
(74) *Attorney, Agent, or Firm* — Oblon, McClelland, Maier & Neustadt, L.L.P.

(57) ABSTRACT

A semiconductor device of embodiments includes: a silicon carbide layer having a first face and a second face and including a first trench, a second trench having a distance of 100 nm or less from the first trench, a first silicon carbide region of n-type, a second silicon carbide region of p-type between the first trench and the second trench, a third silicon carbide region of n-type between the second silicon carbide region and the first face, a fourth silicon carbide region between the first trench and the second silicon carbide region and containing oxygen, and a fifth silicon carbide region between the second trench and the second silicon carbide region and containing oxygen; a first gate electrode in the first trench; a second gate electrode in the second trench; a first gate insulating layer; a second gate insulating layer; a first electrode; and a second electrode.

18 Claims, 31 Drawing Sheets

(51) Int. Cl.
   *H01L 29/16*       (2006.01)
   *H01L 29/167*      (2006.01)
   *H01L 29/66*       (2006.01)
   *H01L 29/78*       (2006.01)
   *B66B 11/04*       (2006.01)
   *H01L 21/04*       (2006.01)
   *H01L 29/04*       (2006.01)
   *H01L 29/423*      (2006.01)
   *H02P 27/06*       (2006.01)

(52) U.S. Cl.
   CPC ...... *H01L 29/1608* (2013.01); *H01L 29/4236* (2013.01); *H01L 29/7825* (2013.01); *H02P 27/06* (2013.01)

(56) References Cited

U.S. PATENT DOCUMENTS

2016/0104794 A1* 4/2016 Takeuchi ............ H01L 29/7813
                                                      257/77
2017/0141206 A1* 5/2017 Koga ................. H01L 29/7802
2017/0200787 A1* 7/2017 Shimizu ................ H01L 29/36
2018/0026639 A1  1/2018 Aurola
2018/0233564 A1* 8/2018 Kumada ................ H01L 29/36
2018/0358445 A1* 12/2018 Kobayashi ......... H01L 29/7397
2020/0168732 A1* 5/2020 Mitani ................ H01L 29/0619
2020/0303494 A1  9/2020 Shimizu
2020/0381253 A1* 12/2020 Schulze ............. H01L 29/0623
2022/0005925 A1  1/2022 Shimizu et al.
2022/0085173 A1  3/2022 Noguchi

FOREIGN PATENT DOCUMENTS

| JP | 2016-63111 A | 4/2016 | |
| JP | 2020-123607 A | 8/2020 | |
| JP | 2020126932 A * | 8/2020 | ............. H01L 29/78 |
| JP | 2020-155486 A | 9/2020 | |
| JP | 2020-181991 A | 11/2020 | |
| JP | 2022-12282 A | 1/2022 | |
| WO | WO 2017/047286 A1 | 3/2017 | |
| WO | WO 2020/188862 A1 | 9/2020 | |

* cited by examiner

SEMICONDUCTOR DEVICE INCLUDING SILICON CARBIDE REGION CONTAINING OXYGEN

CROSS-REFERENCE TO RELATED APPLICATION

This application is based upon and claims the benefit of priority from Japanese Patent Application No. 2021-048710, filed on Mar. 23, 2021, the entire contents of which are incorporated herein by reference.

FIELD

Embodiments described herein relate generally to a semiconductor device, an inverter circuit, a drive device, a vehicle, and an elevator.

BACKGROUND

Silicon carbide (SiC) is expected as a material for next-generation semiconductor devices. Silicon carbide has excellent physical properties, such as a bandgap of about 3 times that of silicon, a breakdown field strength of about 10 times that of silicon, and a thermal conductivity of about 3 times that of silicon. By using such physical properties, it is possible to realize a semiconductor device capable of operating at high temperature with low loss.

In a vertical metal oxide semiconductor field effect transistor (MOSFET), a trench gate structure in which a gate electrode is provided in a trench is applied in order to realize a low on-resistance. By applying the trench gate structure, the channel area per unit area is increased and the on-resistance is reduced.

DETAILED DESCRIPTION

Figure 1:
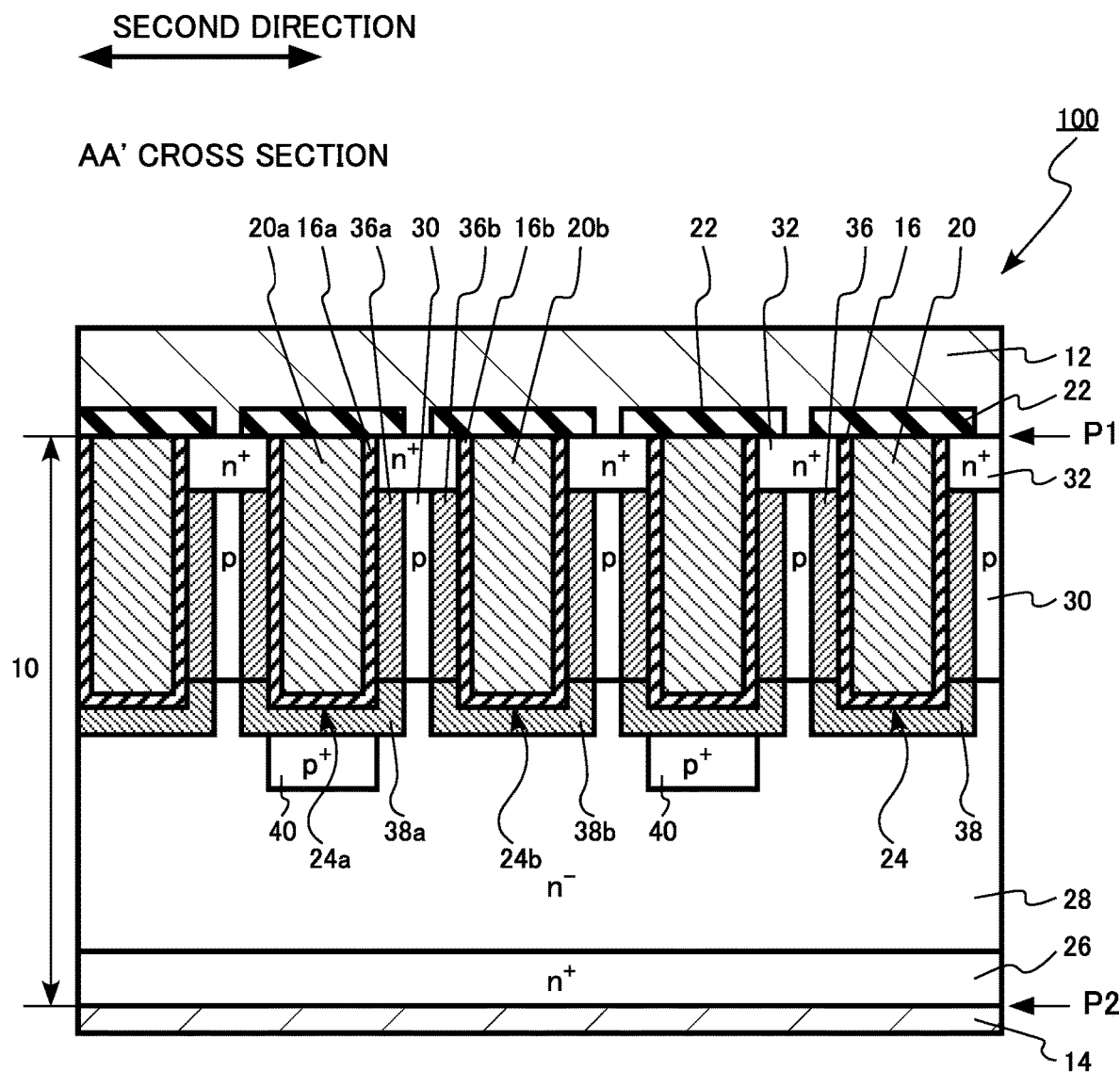
FIG. 1 is a schematic cross-sectional view of a semiconductor device of a first embodiment.

A semiconductor device of embodiments includes: a silicon carbide layer having a first face and a second face opposite to the first face and including: a first trench provided on a side of the first face and extending in a first direction parallel to the first face; a second trench provided on the side of the first face, extending in the first direction, and having a distance of 100 nm or less from the first trench in a second direction parallel to the first face and perpendicular to the first direction; a first silicon carbide region of n-type; a second silicon carbide region of p-type provided between the first silicon carbide region and the first face and provided between the first trench and the second trench; a third silicon carbide region of n-type provided between the second silicon carbide region and the first face and provided between the first trench and the second trench; a fourth silicon carbide region provided between the first trench and the second silicon carbide region and containing oxygen; and a fifth silicon carbide region provided between the second trench and the second silicon carbide region and containing oxygen; a first gate electrode provided in the first trench; a second gate electrode provided in the second trench; a first gate insulating layer provided between the first gate electrode and the silicon carbide layer; a second gate insulating layer provided between the second gate electrode and the silicon carbide layer; a first electrode provided on the side of the first face of the silicon carbide layer and electrically connected to the third silicon carbide region; and a second electrode provided on a side of the second face of the silicon carbide layer.

Hereinafter, embodiments will be described with reference to the diagrams. In the following description, the same or similar members and the like are denoted by the same reference numerals, and the description of the members and the like once described may be omitted as appropriate.

In addition, in the following description, when there are notations of $n^+$, n, $n^-$, $p^+$, p, and $p^-$, these indicate the relative high and low of the impurity concentration in each conductive type. That is, indicates that the n-type impurity concentration is relatively higher than n, and $n^-$ indicates that the n-type impurity concentration is relatively lower than n. In addition, indicates that the p-type impurity concentration is relatively higher than p, and $p^-$ indicates that the p-type impurity concentration is relatively lower than p. In addition, $n^+$-type and $n^-$-type may be simply described as n-type, $p^+$-type and $p^-$-type may be simply described as p-type. Unless otherwise specified, the impurity concentration in each region is represented by, for example, the value of the impurity concentration in the central portion of each region.

The impurity concentration can be measured by, for example, secondary ion mass spectrometry (SIMS). In addition, the relative high and low of the impurity concentration can be determined from, for example, the high and low of the carrier concentration obtained by scanning capacitance microscopy (SCM). In addition, the distance such as the width or depth of an impurity region can be calculated from, for example, SIMS. In addition, the distance such as the width or depth of an impurity region can be calculated from, for example, an SCM image.

The depth of a trench, the thickness of an insulating layer, and the like can be measured, for example, on an image of SIMS or transmission electron microscope (TEM).

The bonding state of oxygen atoms in the silicon carbide layer can be identified by using X-ray photoelectron spectroscopy (XPS), infrared spectroscopy, or Raman spectroscopy. In addition, whether or not the oxygen atom in the silicon carbide layer is disposed at the carbon site of the crystal structure of silicon carbide can be determined by using, for example, X-ray photoelectron spectroscopy, infrared spectroscopy, or Raman spectroscopy.

In addition, whether or not the oxygen atom in the silicon carbide layer is disposed at the silicon site of the crystal structure of silicon carbide can be determined by using, for example, X-ray photoelectron spectroscopy, infrared spectroscopy, or Raman spectroscopy.

First Embodiment

A semiconductor device of a first embodiment includes: a silicon carbide layer having a first face and a second face opposite to the first face and including: a first trench provided on a side of the first face and extending in a first direction parallel to the first face; a second trench provided on the side of the first face, extending in the first direction, and having a distance of 100 nm or less from the first trench in a second direction parallel to the first face and perpendicular to the first direction; a first silicon carbide region of n-type; a second silicon carbide region of p-type provided between the first silicon carbide region and the first face and provided between the first trench and the second trench; a third silicon carbide region of n-type provided between the second silicon carbide region and the first face and provided between the first trench and the second trench; a fourth silicon carbide region provided between the first trench and the second silicon carbide region and containing oxygen; and a fifth silicon carbide region provided between the second trench and the second silicon carbide region and containing oxygen; a first gate electrode provided in the first trench; a second gate electrode provided in the second trench; a first gate insulating layer provided between the first gate electrode and the silicon carbide layer; a second gate insulating layer provided between the second gate electrode and the silicon carbide layer; a first electrode provided on the side of the first face of the silicon carbide layer and electrically connected to the third silicon carbide region; and a second electrode provided on a side of the second face of the silicon carbide layer.

FIG. 1 is a schematic cross-sectional view of the semiconductor device of the first embodiment. The semiconductor device of the first embodiment is a trench gate type vertical MOSFET 100 having a gate electrode in a trench. The MOSFET 100 is an n-channel transistor having electrons as carriers.

Figure 2:
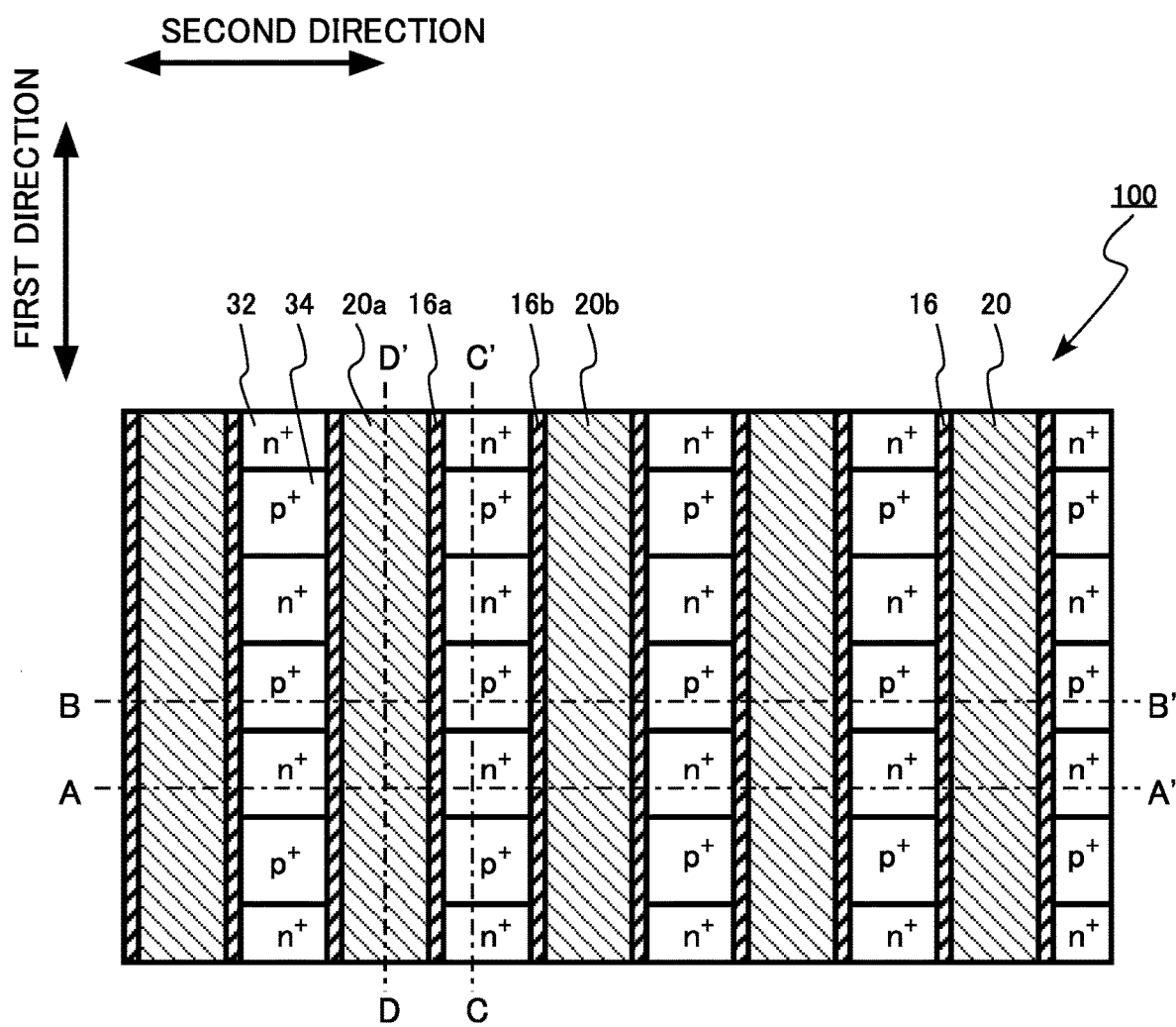
FIG. 2 is a schematic top view of the semiconductor device of the first embodiment.

FIG. 2 is a schematic top view of the semiconductor device of the first embodiment. FIG. 2 is a diagram showing a first face of a silicon carbide layer 10. FIG. 1 shows a cross section taken along the line AA' of FIG. 2.

Figure 3:
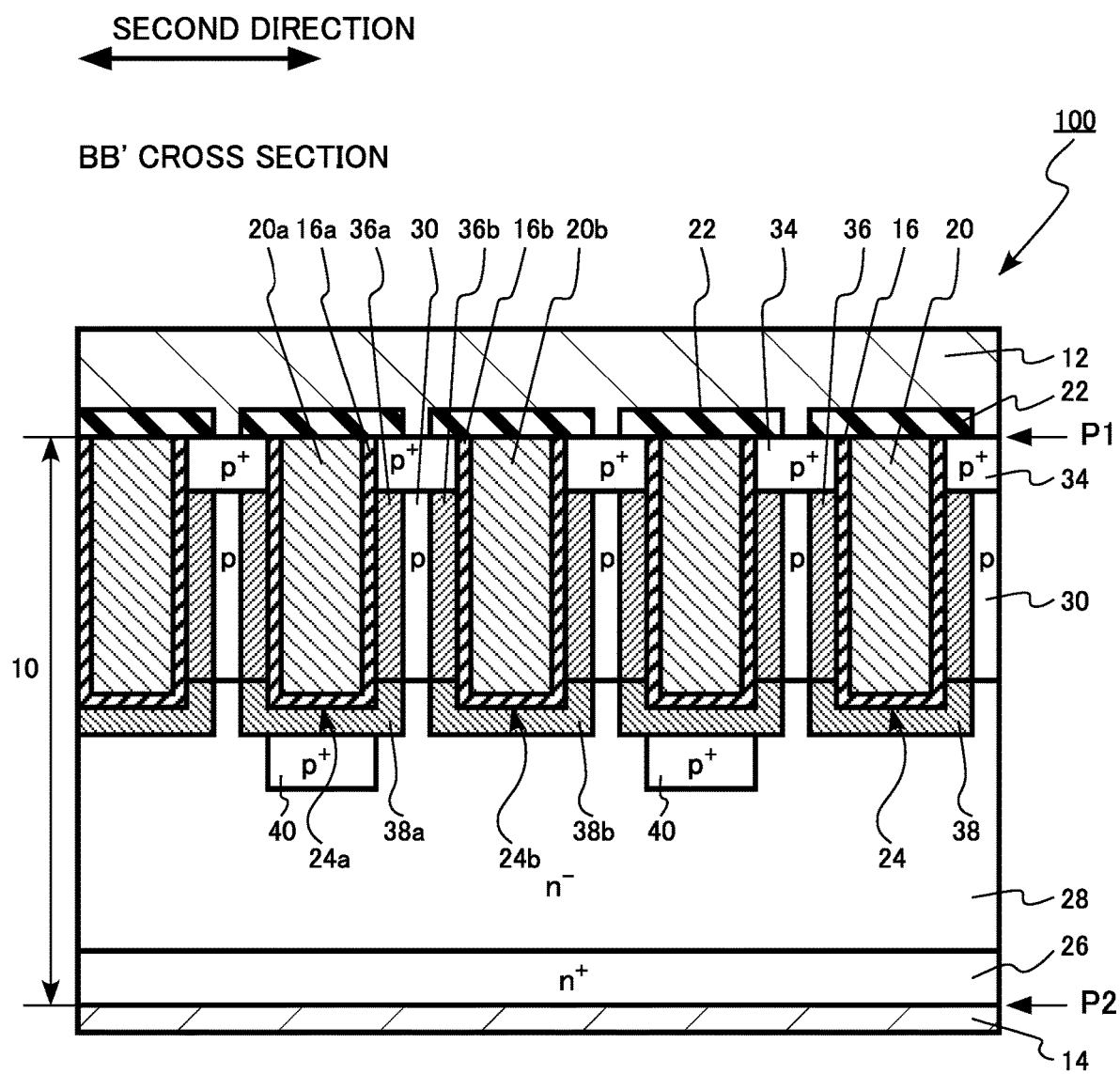
FIG. 3 is a schematic cross-sectional view of the semiconductor device of the first embodiment.
Figure 4:
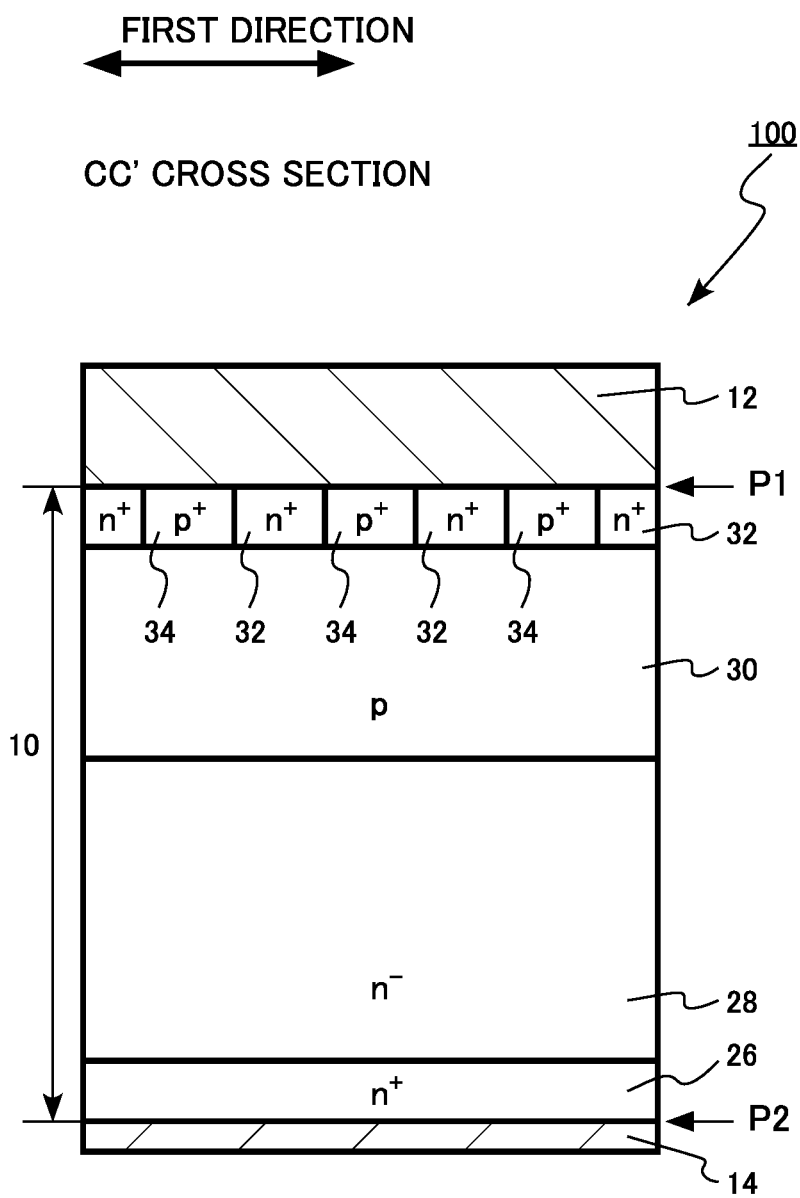
FIG. 4 is a schematic cross-sectional view of the semiconductor device of the first embodiment.
Figure 5:
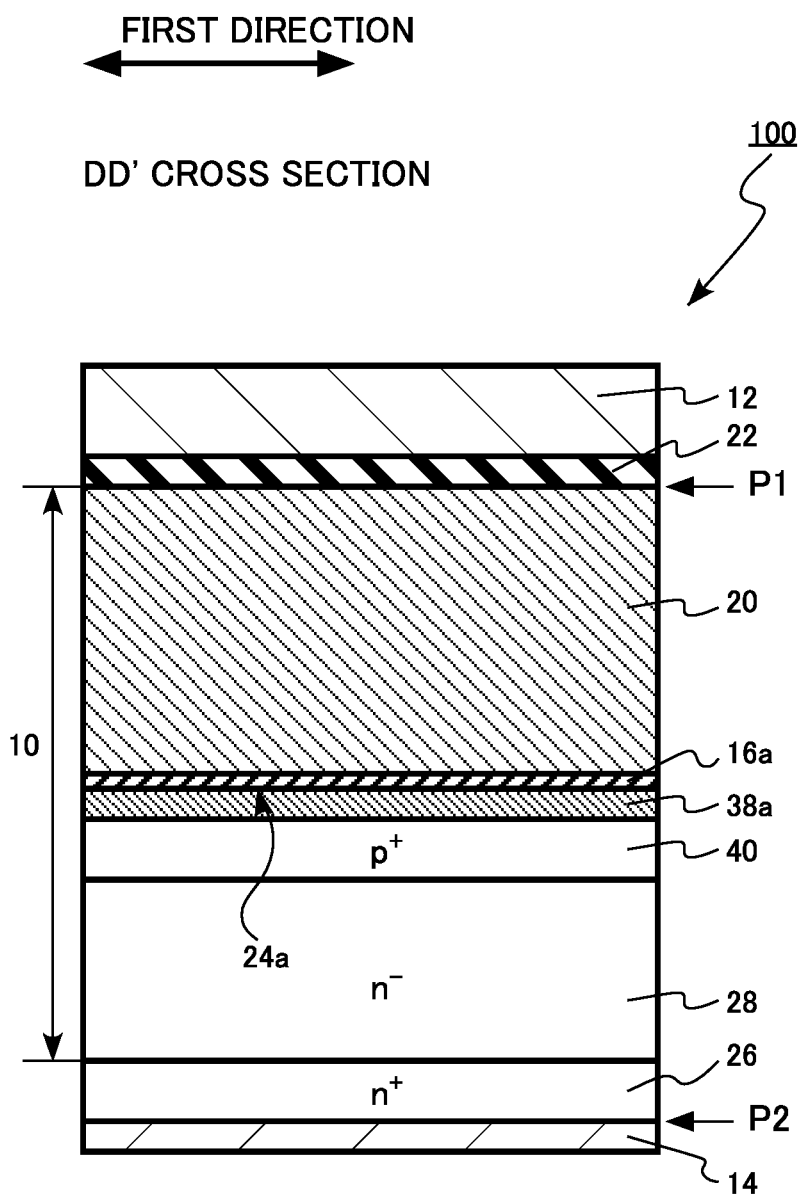
FIG. 5 is a schematic cross-sectional view of the semiconductor device of the first embodiment.

FIGS. 3, 4, and 5 are schematic cross-sectional views of the semiconductor device of the first embodiment. FIG. 3 shows a cross section taken along the line BB' of FIG. 2. FIG. 4 shows a cross section taken along the line CC' of FIG. 2. FIG. 5 shows a cross section taken along the line DD' of FIG. 2.

Figure 6:
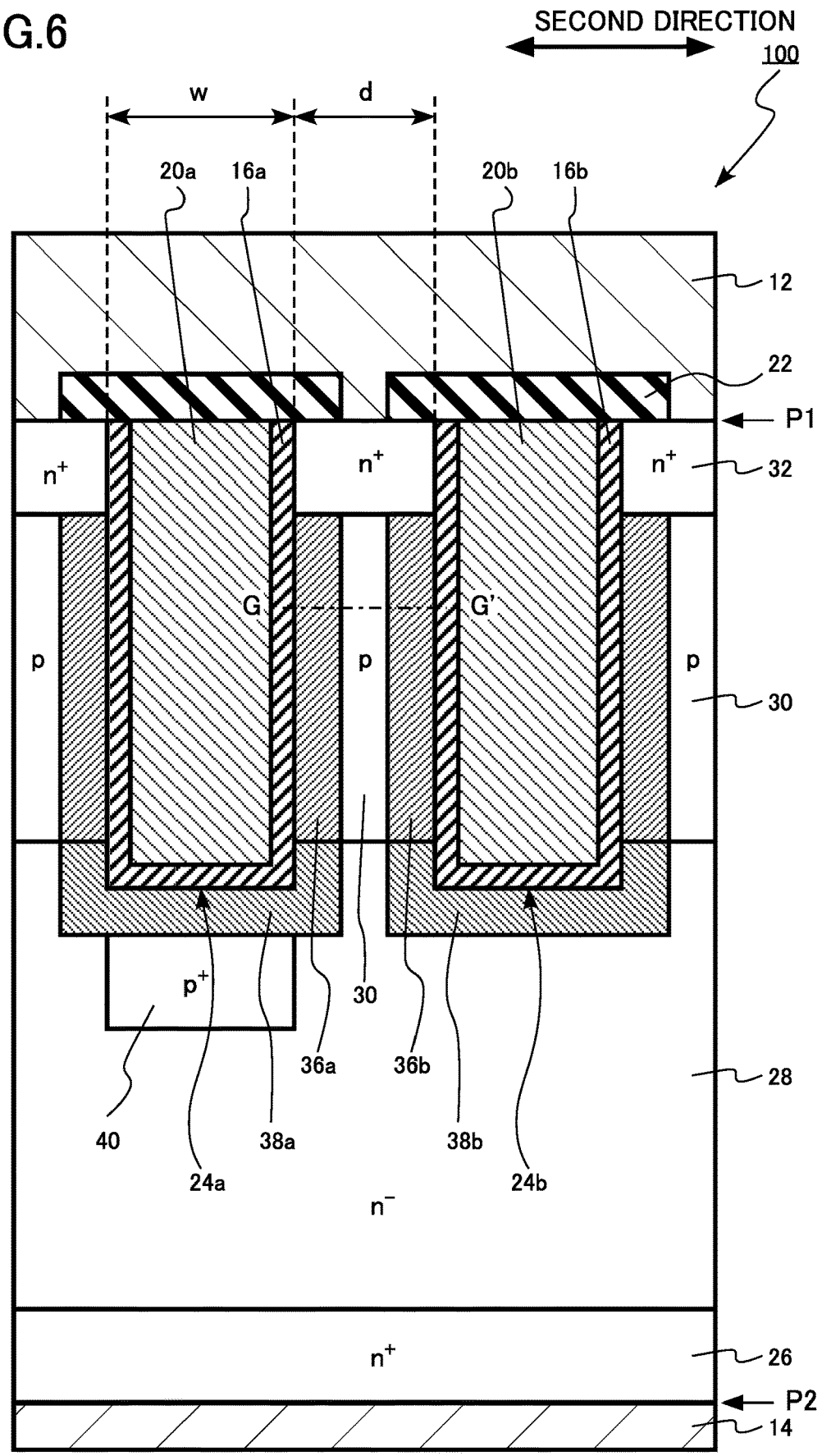
FIG. 6 is an enlarged schematic cross-sectional view of the semiconductor device of the first embodiment.

FIG. 6 is an enlarged schematic cross-sectional view of the semiconductor device of the first embodiment. FIG. 6 shows an enlarged cross section of a part of FIG. 1.

The MOSFET 100 includes the silicon carbide layer 10, a source electrode 12 (first electrode), a drain electrode 14 (second electrode), a gate insulating layer 16, a gate electrode 20, and an interlayer insulating layer 22. The source electrode 12 is an example of the first electrode. The drain electrode 14 is an example of the second electrode.

The gate insulating layer 16 includes a first gate insulating layer 16a and a second gate insulating layer 16b. The gate electrode 20 includes a first gate electrode 20a and a second gate electrode 20b.

The silicon carbide layer 10 includes a trench 24, a drain region 26, a drift region 28 (first silicon carbide region), a p-well region 30 (second silicon carbide region), a source region 32 (third silicon carbide region), a p-well contact region 34 (eighth silicon carbide region), a side surface oxygen region 36, a bottom surface oxygen region 38, and a p-bottom region 40 (ninth silicon carbide region).

The trench 24 includes a first trench 24a and a second trench 24b. The side surface oxygen region 36 includes a first side surface oxygen region 36a (fourth silicon carbide region) and a second side surface oxygen region 36b (fifth silicon carbide region). The bottom surface oxygen region 38 includes a first bottom surface oxygen region 38a (sixth silicon carbide region) and a second bottom surface oxygen region 38b (seventh silicon carbide region).

The drift region 28 is an example of the first silicon carbide region. The p-well region 30 is an example of the second silicon carbide region. The source region 32 is an example of the third silicon carbide region. The p-well contact region 34 is an example of the eighth silicon carbide region. The p-bottom region 40 is an example of the ninth silicon carbide region. The first side surface oxygen region 36a is an example of the fourth silicon carbide region. The second side surface oxygen region 36b is an example of the fifth silicon carbide region. The first bottom surface oxygen region 38a is an example of the sixth silicon carbide region. The second bottom surface oxygen region 38b is an example of the seventh silicon carbide region. The p-bottom region 40 is an example of the ninth silicon carbide region.

Figure 7:
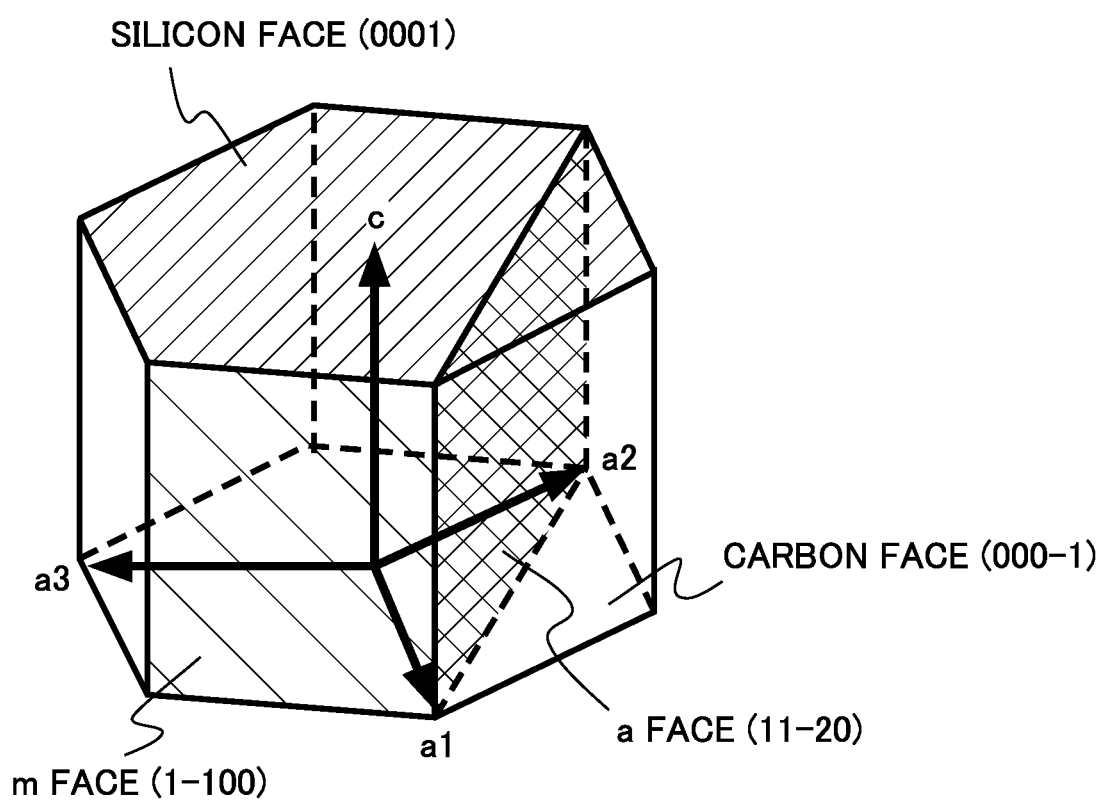
FIG. 7 is a diagram showing the crystal structure of a SiC semiconductor.

FIG. 7 is a diagram showing the crystal structure of a SiC semiconductor. A typical crystal structure of the SiC semiconductor is a hexagonal crystal system such as 4H—SiC.

In the SiC semiconductor of hexagonal crystal system, one of the faces (top face of the hexagonal column) whose normal line is a c-axis along the axial direction of the hexagonal column is a (0001) face. The (0001) face is referred to as a silicon face. Silicon atoms (Si) are arranged on the outermost surface of the silicon face.

The other side of the face (top face of the hexagonal column) whose normal line is the c-axis along the axial direction of the hexagonal column is a (000-1) face. The (000-1) face is referred to as a carbon face. Carbon atoms (C) are arranged on the outermost surface of the carbon face.

The side face (pillar face) of the hexagonal column is an m face that is a face equivalent to the (1-100) face, that is, a {1-100} face. In addition, the face passing through a pair of ridge lines not adjacent to each other is an a face that is a face equivalent to the (11-20) face, that is, a {11-20} face. Both silicon atoms (Si) and carbon atoms (C) are arranged on the outermost surfaces of the m face and the a face.

The silicon carbide layer 10 is, for example, a single crystal of 4H—SiC. The silicon carbide layer 10 has a first face P1 and a second face P2. The second face P2 is opposite to the first face P1. The first face P1 is a surface of the silicon carbide layer 10, and the second face P2 is a back surface of the silicon carbide layer 10.

The direction parallel to the first face P1 is defined as a first direction. The direction parallel to the first face and perpendicular to the first direction is defined as a second direction.

In this specification, the "depth" means a depth with respect to the first face P1.

Hereinafter, a case where the first face P1 of the silicon carbide layer 10 is a face inclined by an angle of 0° or more and 10° or less with respect to the silicon face and the second face P2 is a face inclined by an angle of 0° or more and 10° or less with respect to the carbon face will be described as an example. The first face P1 of the silicon carbide layer 10 has an off-angle of 0° or more and 10° or less with respect to the silicon face.

The characteristics of the face inclined by an angle of 0° or more and 10° or less with respect to the silicon face can be considered to be approximately equal to the silicon face. In addition, the face inclined by an angle of 0° or more and 10° or less with respect to the carbon face can be considered to be approximately equal to the carbon face.

The trench 24 is provided on the first face P1 side of the silicon carbide layer 10. The trench 24 is a groove provided in the silicon carbide layer 10.

The trench 24 extends in the first direction on the first face P1. The trench 24 is repeatedly arranged in the second direction.

The width of the trench 24 in the second direction is, for example, equal to or more than 100 nm and equal to or less than 500 nm. The distance between the trench 24 and the trench 24 in the second direction is equal to or less than 100 nm. The depth of the trench 24 is, for example, equal to or more than 0.5 μm and equal to or less than 2 μm.

The first trench 24a is provided on the first face P1 side of the silicon carbide layer 10. The first trench 24a extends in the first direction on the first face P1. The second trench 24b is provided on the first face P1 side of the silicon carbide layer 10. The second trench 24b extends in the first direction on the first face P1.

The second trench 24b is adjacent to the first trench 24a in the second direction. The distance (d in FIG. 6) between the first trench 24a and the second trench 24b in the second direction is equal to or less than 100 nm.

The width (w in FIG. 6) of the first trench 24a in the second direction is larger than, for example, the distance d between the first trench 24a and the second trench 24b in the second direction. The width w of the first trench 24a in the second direction is, for example, 1.5 times or more the distance d between the first trench 24a and the second trench 24b in the second direction.

The drain region 26 is an n$^+$-type SiC. The drain region 26 contains, for example, nitrogen (N) as an n-type impurity. The n-type impurity concentration in the drain region 26 is, for example, equal to or more than $1\times10^{18}$ cm$^{-3}$ and equal to or less than $1\times10^{21}$ cm$^{-3}$.

The drift region 28 is an n$^-$-type SiC. The drift region 28 is disposed between the drain region 26 and the first face P1.

The drift region 28 contains, for example, nitrogen (N) as an n-type impurity. The n-type impurity concentration in the drift region 28 is, for example, equal to or more than $1\times10^{15}$ cm$^{-3}$ and equal to or less than $2\times10^{16}$ cm$^{-3}$. The n-type impurity concentration in the drift region 28 is lower than the n-type impurity concentration in the drain region 26.

The drift region 28 is, for example, a SiC epitaxial growth layer formed on the drain region 26 by epitaxial growth. The thickness of the drift region 28 is, for example, equal to or more than 5 μm and equal to or less than 100 μm.

The p-well region 30 is a p-type SiC. The p-well region 30 is disposed between the drift region 28 and the first face P1. The p-well region 30 extends in the first direction.

The p-well region 30 is provided between the trench 24 and the trench 24. The p-well region 30 is provided, for example, between the first trench 24a and the second trench 24b.

The p-well region 30 contains, for example, aluminum (Al) as a p-type impurity. The p-type impurity concentration in the p-well region 30 is, for example, equal to or more than $1\times10^{16}$ cm$^{-3}$ and equal to or less than $1\times10^{20}$ cm$^{-3}$. The maximum p-type impurity concentration in the p-well region 30 is, for example, equal to or more than $1\times10^{16}$ cm$^{-3}$ and equal to or less than $1\times10^{20}$ cm$^{-3}$.

The depth of the p-well region 30 is, for example, equal to or more than 0.3 μm and equal to or less than 1.5 μm. The p-well region 30 functions as a channel region of the MOSFET 100.

The source region 32 is an n$^+$-type SiC. The source region 32 is disposed between the p-well region 30 and the first face P1. The source region 32 is in contact with the first face P1. The source region 32 is provided between the trench 24 and the trench 24. The source region 32 is electrically connected to the source electrode 12.

The source region 32 contains, for example, phosphorus (P) as an n-type impurity. The n-type impurity concentration in the source region 32 is, for example, equal to or more than $1\times10^{18}$ cm$^{-3}$ and equal to or less than $1\times10^{22}$ cm$^{-3}$. The n-type impurity concentration in the source region 32 is higher than the n-type impurity concentration in the drift region 28.

The depth of the source region 32 is smaller than the depth of the p-well region 30. The depth of the source region 32 is, for example, equal to or more than 0.1 µm and equal to or less than 0.4 µm.

The p-well contact region 34 is a p$^+$-type SiC. The p-well contact region 34 is disposed between the p-well region 30 and the first face P1. The p-well contact region 34 is in contact with the first face P1. The p-well contact region 34 is in contact with the p-well region 30.

The p-well contact region 34 is adjacent to the source region 32 in the second direction. The source region 32 and the p-well contact region 34 are alternately provided in the first direction on the first face P1. The p-well contact region 34 is electrically connected to the source electrode 12.

The p-well contact region 34 contains, for example, aluminum as a p-type impurity. The p-type impurity concentration in the p-well contact region 34 is, for example, equal to or more than $1\times10^{18}$ cm$^{-3}$ and equal to or less than $1\times10^{22}$ cm$^{-3}$. The p-type impurity concentration in the p-well contact region 34 is higher than the p-type impurity concentration in the p-well region 30.

The depth of the p-well contact region 34 is smaller than the depth of the p-well region 30. The depth of the p-well contact region 34 is, for example, equal to or more than 0.1 µm and equal to or less than 0.4 µm.

The p-bottom region 40 is a p$^+$-type SiC. The p-bottom region 40 is provided between some of the trenches 24 and the drift region 28. The p-bottom region 40 is not provided between the rest of the trenches 24 and the drift region 28. The p-bottom region 40 is electrically connected to the source electrode 12 in a region that is not shown, for example.

The p-bottom region 40 is provided at the bottoms of some of the trenches 24 and not provided at the bottoms of the rest of the trenches 24. For example, the trench 24 having the p-bottom region 40 and the trench 24 having no p-bottom region 40 are alternately arranged in the second direction. In addition, the ratio between the trench 24 having the p-bottom region 40 and the trench 24 having no p-bottom region 40 is not limited to 1:1 shown in FIG. 1. For example, the number of trenches 24 having no p-bottom region 40 that are interposed between the trenches 24 having the p-bottom region 40 may be 2 or more.

The p-bottom region 40 is provided between the first trench 24a and the drift region 28. The p-bottom region 40 is not provided between the second trench 24b and the drift region 28.

The p-bottom region 40 is provided between the bottom surface oxygen region 38 and the drift region 28.

The p-bottom region 40 contains, for example, aluminum as a p-type impurity. The p-type impurity concentration in the p-bottom region 40 is, for example, equal to or more than $1\times10^{18}$ cm$^{-3}$ and equal to or less than $1\times10^{22}$ cm$^{-3}$. The p-type impurity concentration in the p-bottom region 40 is higher than the p-type impurity concentration in the p-well region 30.

The side surface oxygen region 36 is a p-type SiC. The side surface oxygen region 36 is provided between the drift region 28 and the first face P1. The side surface oxygen region 36 is provided between the trench 24 and the trench 24. The side surface oxygen region 36 extends in the first direction.

The side surface oxygen region 36 is provided on the side surface of the trench 24. The side surface oxygen region 36 is provided between the trench 24 and the p-well region 30. The side surface oxygen region 36 is provided between the gate insulating layer 16 and the p-well region 30. The side surface oxygen region 36 is in contact with, for example, the gate insulating layer 16.

For example, the first side surface oxygen region 36a is provided between the drift region 28 and the first face P1. The first side surface oxygen region 36a is provided between the first trench 24a and the second trench 24b.

For example, the first side surface oxygen region 36a is provided on the side surface of the first trench 24a. The first side surface oxygen region 36a is provided between the first trench 24a and the p-well region 30. The first side surface oxygen region 36a is provided between the first gate insulating layer 16a and the p-well region 30. The first side surface oxygen region 36a is in contact with, for example, the first gate insulating layer 16a.

For example, the second side surface oxygen region 36b is provided between the drift region 28 and the first face P1. The second side surface oxygen region 36b is provided between the first trench 24a and the second trench 24b.

For example, the second side surface oxygen region 36b is provided on the side surface of the second trench 24b. The second side surface oxygen region 36b is provided between the second trench 24b and the p-well region 30. The second side surface oxygen region 36b is provided between the second gate insulating layer 16b and the p-well region 30. The second side surface oxygen region 36b is in contact with, for example, the second gate insulating layer 16b.

The side surface oxygen region 36 contains, for example, aluminum (Al) as a p-type impurity. The p-type impurity concentration in the side surface oxygen region 36 is, for example, equal to or more than $1\times10^{16}$ cm$^{-3}$ and equal to or less than $1\times10^{20}$ cm$^{-3}$. The maximum p-type impurity concentration in the side surface oxygen region 36 is, for example, equal to or more than $1\times10^{16}$ cm$^{-3}$ and equal to or less than $1\times10^{20}$ cm$^{-3}$.

The side surface oxygen region 36 contains oxygen. The oxygen concentration in the side surface oxygen region 36 is, for example, equal to or more than $1\times10^{17}$ cm$^{-3}$ and equal to or less than $1\times10^{23}$ cm$^{-3}$. The maximum oxygen concentration in the side surface oxygen region 36 is, for example, equal to or more than $1\times10^{17}$ cm$^{-3}$ and equal to or less than $1\times10^{23}$ cm$^{-3}$.

The oxygen concentration in the side surface oxygen region 36 is higher than, for example, the oxygen concentration in the p-well region 30. The maximum oxygen concentration in the side surface oxygen region 36 is, for example, higher than the maximum oxygen concentration in the p-well region 30.

The oxygen concentration in the side surface oxygen region 36 is higher than, for example, the aluminum concentration in the side surface oxygen region 36. The maximum oxygen concentration in the side surface oxygen region 36 is, for example, higher than the maximum aluminum concentration in the side surface oxygen region 36.

The first side surface oxygen region 36a contains, for example, aluminum (Al) as a p-type impurity. The p-type impurity concentration in the first side surface oxygen region 36a is, for example, equal to or more than $1\times10^{16}$ cm$^{-3}$ and equal to or less than $1\times10^{20}$ cm$^{-3}$. The maximum p-type impurity concentration in the first side surface oxygen region 36a is, for example, equal to or more than $1\times10^{16}$ cm$^{-3}$ and equal to or less than $1\times10^{20}$ cm$^{-3}$.

The first side surface oxygen region 36a contains oxygen. The oxygen concentration in the first side surface oxygen region 36a is, for example, equal to or more than $1\times10^{17}$ cm$^{-3}$ and equal to or less than $1\times10^{23}$ cm$^{-3}$. The maximum oxygen concentration in the first side surface oxygen region 36a is, for example, equal to or more than $1\times10^{17}$ cm$^{-3}$ and equal to or less than $1\times10^{23}$ cm$^{-3}$.

The oxygen concentration in the first side surface oxygen region 36a is higher than, for example, the oxygen concentration in the p-well region 30. The maximum oxygen concentration in the first side surface oxygen region 36a is higher than, for example, the maximum oxygen concentration in the p-well region 30.

The oxygen concentration in the first side surface oxygen region 36a is higher than, for example, the aluminum concentration in the first side surface oxygen region 36a. The maximum oxygen concentration in the first side surface oxygen region 36a is higher than, for example, the maximum aluminum concentration in the first side surface oxygen region 36a.

The second side surface oxygen region 36b contains, for example, aluminum (Al) as a p-type impurity. The p-type impurity concentration in the second side surface oxygen region 36b is, for example, equal to or more than $1\times10^{16}$ cm$^{-3}$ and equal to or less than $1\times10^{20}$ cm$^{-3}$. The maximum p-type impurity concentration in the second side surface oxygen region 36b is, for example, equal to or more than $1\times10^{16}$ cm$^{-3}$ and equal to or less than $1\times10^{20}$ cm$^{-3}$.

The second side surface oxygen region 36b contains oxygen. The oxygen concentration in the second side surface oxygen region 36b is, for example, equal to or more than $1\times10^{17}$ cm$^{-3}$ and equal to or less than $1\times10^{23}$ cm$^{-3}$. The maximum oxygen concentration in the second side surface oxygen region 36b is, for example, equal to or more than $1\times10^{17}$ cm$^{-3}$ and equal to or less than $1\times10^{23}$ cm$^{-3}$.

The oxygen concentration in the second side surface oxygen region 36b is higher than, for example, the oxygen concentration in the p-well region 30. The maximum oxygen concentration in the second side surface oxygen region 36b is higher than, for example, the maximum oxygen concentration in the p-well region 30.

The oxygen concentration in the second side surface oxygen region 36b is higher than, for example, the aluminum concentration in the second side surface oxygen region 36b. The maximum oxygen concentration in the second side surface oxygen region 36b is higher than, for example, the maximum aluminum concentration in the second side surface oxygen region 36b.

Figure 8:
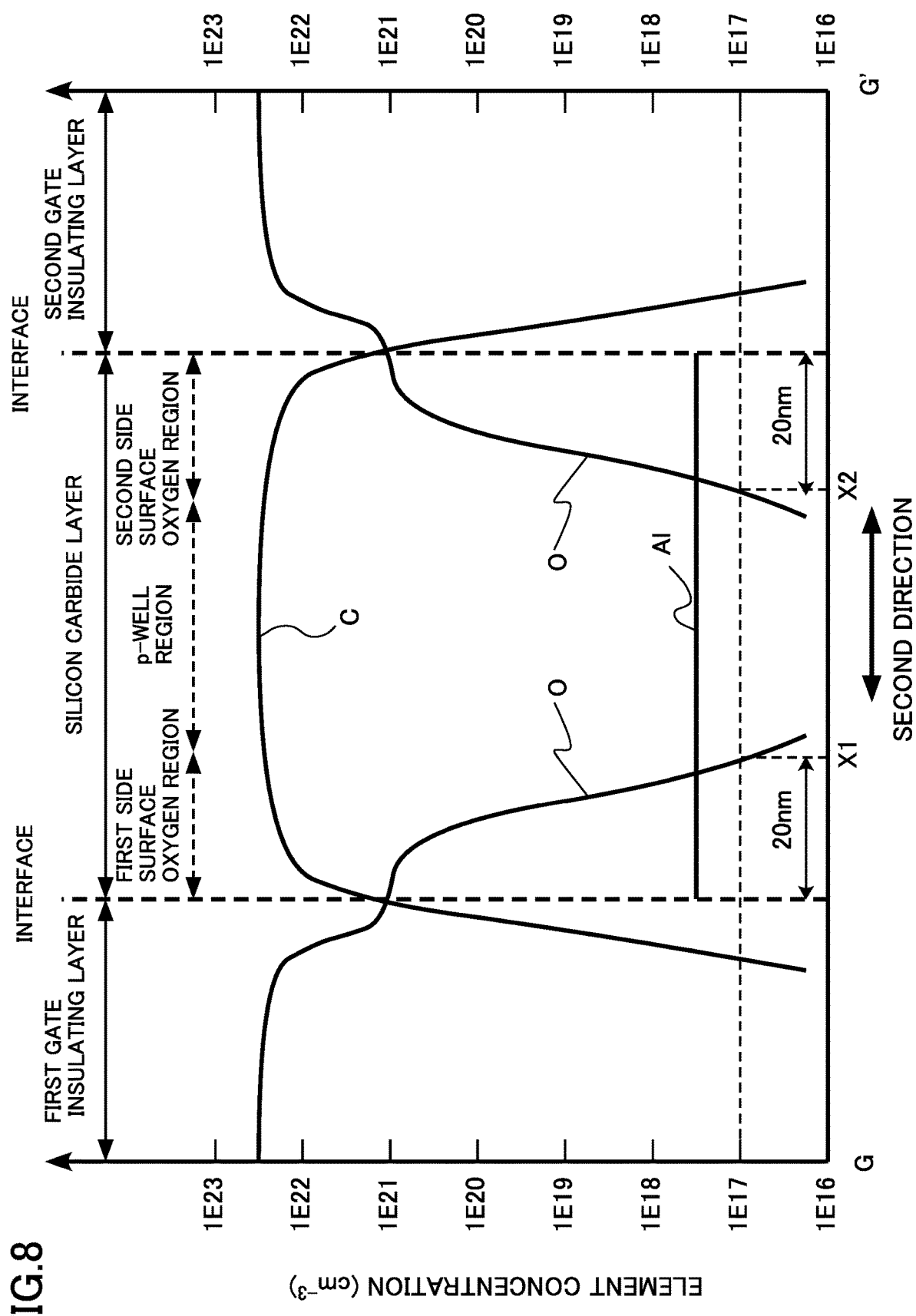
FIG. 8 is a diagram showing the element concentration distribution of the semiconductor device of the first embodiment.

FIG. 8 is a diagram showing the element concentration distribution of the semiconductor device of the first embodiment. FIG. 8 shows the concentration distribution of oxygen (O), carbon (C), and aluminum (Al) in the second direction. FIG. 8 shows an element concentration distribution along the line GG' of FIG. 6. FIG. 8 shows an element concentration distribution in a portion including the first gate insulating layer 16a, the first side surface oxygen region 36a, the p-well region 30, the second side surface oxygen region 36b, and the second gate insulating layer 16b.

A position (X1 in FIG. 8) 20 nm away from the interface between the first gate insulating layer 16a and the silicon carbide layer 10 toward the silicon carbide layer 10 is defined as a first position. The oxygen concentration at the first position X1 is, for example, less than $1\times10^{17}$ cm$^{-3}$.

A position (X2 in FIG. 8) 20 nm away from the interface between the second gate insulating layer 16b and the silicon carbide layer 10 toward the silicon carbide layer 10 is defined as a second position. The oxygen concentration at the second position X2 is, for example, less than $1\times10^{17}$ cm$^{-3}$.

Regarding the identification of the position of the interface between the first gate insulating layer 16a and the silicon carbide layer 10, for example, the element concentration distribution is measured by SIMS, and a position where the oxygen concentration decreasing from the first gate insulating layer 16a toward the silicon carbide layer 10 matches the carbon concentration decreasing from the silicon carbide layer 10 toward the first gate insulating layer 16a is defined as the position of the interface. The identification of the position of the interface between the second gate insulating layer 16b and the silicon carbide layer 10 is also defined in the same manner.

The bottom surface oxygen region 38 is a p$^-$-type SiC or n$^-$-type SiC. The bottom surface oxygen region 38 is provided between the trench 24 and the drift region 28. The bottom surface oxygen region 38 between the drift region 28 and the trench 24 where the p-bottom region 40 is provided at the bottom is a p$^+$-type SiC. The bottom surface oxygen region 38 between the drift region 28 and the trench 24 where the p-bottom region 40 is not provided at the bottom is an n$^-$-type SiC.

The bottom surface oxygen region 38 is in contact with, for example, the gate insulating layer 16.

For example, the first bottom surface oxygen region 38a is a p$^-$-type SiC. The first bottom surface oxygen region 38a is provided between the first trench 24a and the drift region 28. The first bottom surface oxygen region 38a is provided between the first trench 24a and the p-bottom region 40.

The first bottom surface oxygen region 38a contains, for example, aluminum (Al) as a p-type impurity. The p-type impurity concentration in the first bottom surface oxygen region 38a is, for example, equal to or more than $1\times10^{18}$ cm$^{-3}$ and equal to or less than $1\times10^{22}$ cm$^{-3}$. The p-type impurity concentration in the first bottom surface oxygen region 38a is higher than, for example, the p-type impurity concentration in the p-well region 30.

The first bottom surface oxygen region 38a contains oxygen. The oxygen concentration in the first bottom surface oxygen region 38a is, for example, equal to or more than $1\times10^{17}$ cm$^{-3}$ and equal to or less than $1\times10^{23}$ cm$^{-3}$. The maximum oxygen concentration in the first bottom surface oxygen region 38a is, for example, equal to or more than $1\times10^{17}$ cm$^{-3}$ and equal to or less than $1\times10^{23}$ cm$^{-3}$.

The oxygen concentration in the first bottom surface oxygen region 38a is higher than, for example, the oxygen concentration in the p-bottom region 40. The maximum oxygen concentration in the first bottom surface oxygen region 38a is higher than, for example, the maximum oxygen concentration in the p-bottom region 40.

The oxygen concentration in the first bottom surface oxygen region 38a is higher than, for example, the aluminum concentration in the first bottom surface oxygen region 38a. The maximum oxygen concentration in the first bottom surface oxygen region 38a is higher than, for example, the maximum aluminum concentration in the first bottom surface oxygen region 38a.

For example, the second bottom surface oxygen region 38b is an n$^-$-type SiC. The second bottom surface oxygen region 38b is provided between the second trench 24b and the drift region 28.

The second bottom surface oxygen region 38b contains, for example, phosphorus (P) or nitrogen (N) as an n-type impurity. The n-type impurity concentration in the second bottom surface oxygen region 38b is, for example, equal to or more than $1\times10^{13}$ cm$^{-3}$ and equal to or less than $2\times10^{16}$ cm$^{-3}$.

The second bottom surface oxygen region 38b contains oxygen. The oxygen concentration in the second bottom surface oxygen region 38b is, for example, equal to or more than $1\times10^{17}$ cm$^{-3}$ and equal to or less than $1\times10^{23}$ cm$^{-3}$. The maximum oxygen concentration in the second bottom surface oxygen region 38b is, for example, equal to or more than $1\times10^{17}$ cm$^{-3}$ and equal to or less than $1\times10^{23}$ cm$^{-3}$.

The oxygen concentration in the second bottom surface oxygen region 38b is higher than, for example, the oxygen concentration in the drift region 28. The maximum oxygen concentration in the second bottom surface oxygen region 38b is higher than, for example, the maximum oxygen concentration in the drift region 28.

The oxygen concentration in the second bottom surface oxygen region 38b is higher than, for example, the phosphorus concentration or the nitrogen concentration in the second bottom surface oxygen region 38b. The maximum oxygen concentration in the second bottom surface oxygen region 38b is higher than, for example, the maximum phosphorus concentration or the maximum nitrogen concentration in the second bottom surface oxygen region 38b.

The side surface oxygen region 36 and the bottom surface oxygen region 38 contain an oxygen atom bonded to four silicon atoms.

Figure 9A:
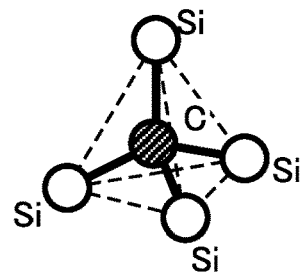
FIGS. 9A, 9B, 9C, and 9D are explanatory diagrams of a side surface oxygen region and a bottom surface oxygen region in the first embodiment.
Figure 9B:
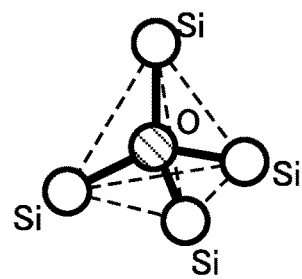
Figure 9C:
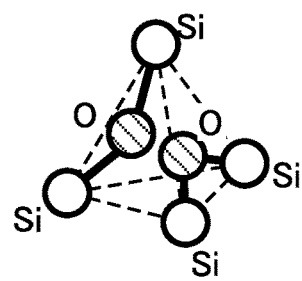
Figure 9D:
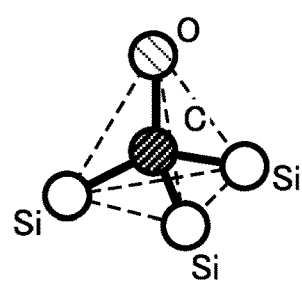

FIGS. 9A, 9B, 9C, and 9D are explanatory diagrams of the side surface oxygen region and the bottom surface oxygen region in the first embodiment. FIG. 9A is a diagram showing the crystal structure of silicon carbide. FIG. 9B is a diagram showing a structure present in the side surface oxygen region 36 and the bottom surface oxygen region 38. FIG. 9C shows a structure containing an oxygen atom, which is different from FIG. 9B. FIG. 9D shows a structure containing an oxygen atom, which is different from FIGS. 9B and 9C.

In the structure shown in FIG. 9B, there is one oxygen atom bonded to four silicon atoms. In other words, in the structure shown in FIG. 9B, there is one oxygen atom disposed at the carbon site of the crystal structure of silicon carbide shown in FIG. 9A. In other words, in the structure shown in FIG. 9B, the carbon atom in the crystal structure of silicon carbide is substituted by one oxygen atom. The structure shown in FIG. 9B is referred to as a first structure.

In the structure shown in FIG. 9C, there are oxygen atoms bonded to two silicon atoms. In other words, in the structure shown in FIG. 9C, there are two oxygen atoms disposed at the carbon sites of the crystal structure of silicon carbide shown in FIG. 9A. In other words, in the structure shown in FIG. 9C, the carbon atom in the crystal structure of silicon carbide is substituted by two oxygen atoms. The structure shown in FIG. 9C is referred to as a second structure.

In the structure shown in FIG. 9D, there is an oxygen atom bonded to a carbon atom. In other words, in the structure shown in FIG. 9D, there is one oxygen atom disposed at the silicon site of the crystal structure of silicon carbide shown in FIG. 9A. In other words, in the structure shown in FIG. 9D, a silicon atom in the crystal structure of silicon carbide is substituted by one oxygen atom. The structure shown in FIG. 9D is referred to as a third structure.

The side surface oxygen region 36 contains an oxygen atom bonded to four silicon atoms. The side surface oxygen region 36 includes the first structure.

The concentration of oxygen atoms bonded to four silicon atoms in the side surface oxygen region 36 is higher than, for example, the concentration of oxygen atoms bonded to two silicon atoms in the side surface oxygen region 36. In other words, the concentration of the first structure in the side surface oxygen region 36 is higher than, for example, the concentration of the second structure in the side surface oxygen region 36.

The concentration of oxygen atoms bonded to four silicon atoms in the side surface oxygen region 36 is higher than, for example, the concentration of oxygen atoms bonded to the carbon atom in the side surface oxygen region 36. In other words, the concentration of the first structure in the side surface oxygen region 36 is higher than, for example, the concentration of the third structure in the side surface oxygen region 36.

In addition, when the gate insulating layer 16 contains silicon oxide, the oxygen atom in the silicon oxide is bonded to two silicon atoms.

The first side surface oxygen region 36a contains an oxygen atom bonded to four silicon atoms. The first side surface oxygen region 36a includes the first structure.

The concentration of oxygen atoms bonded to four silicon atoms in the first side surface oxygen region 36a is higher than, for example, the concentration of oxygen atoms bonded to two silicon atoms in the first side surface oxygen region 36a. In other words, the concentration of the first structure in the first side surface oxygen region 36a is higher than, for example, the concentration of the second structure in the first side surface oxygen region 36a.

The concentration of oxygen atoms bonded to four silicon atoms in the first side surface oxygen region 36a is higher than, for example, the concentration of oxygen atoms bonded to the carbon atom in the first side surface oxygen region 36a. In other words, the concentration of the first structure in the first side surface oxygen region 36a is higher than, for example, the concentration of the third structure in the first side surface oxygen region 36a.

The second side surface oxygen region 36b contains an oxygen atom bonded to four silicon atoms. The second side surface oxygen region 36b includes the first structure.

The concentration of oxygen atoms bonded to four silicon atoms in the second side surface oxygen region 36b is higher than, for example, the concentration of oxygen atoms bonded to two silicon atoms in the second side surface oxygen region 36b. In other words, the concentration of the first structure in the second side surface oxygen region 36b is higher than, for example, the concentration of the second structure in the second side surface oxygen region 36b.

The concentration of oxygen atoms bonded to four silicon atoms in the second side surface oxygen region 36b is higher than, for example, the concentration of oxygen atoms bonded to the carbon atom in the second side surface oxygen region 36b. In other words, the concentration of the first structure in the second side surface oxygen region 36b is higher than, for example, the concentration of the third structure in the second side surface oxygen region 36b.

The bottom surface oxygen region contains an oxygen atom bonded to four silicon atoms. The bottom surface oxygen region includes the first structure.

The concentration of oxygen atoms bonded to four silicon atoms in the bottom surface oxygen region is higher than, for example, the concentration of oxygen atoms bonded to two silicon atoms in the bottom surface oxygen region. In other words, the concentration of the first structure in the bottom surface oxygen region is higher than, for example, the concentration of the second structure in the bottom surface oxygen region.

The concentration of oxygen atoms bonded to four silicon atoms in the bottom surface oxygen region is higher than, for example, the concentration of oxygen atoms bonded to the carbon atom in the bottom surface oxygen region. In other words, the concentration of the first structure in the bottom surface oxygen region is higher than, for example, the concentration of the third structure in the bottom surface oxygen region.

The first bottom surface oxygen region 38a contains an oxygen atom bonded to four silicon atoms. The first bottom surface oxygen region 38a includes the first structure.

The concentration of oxygen atoms bonded to four silicon atoms in the first bottom surface oxygen region 38a is higher than, for example, the concentration of oxygen atoms bonded to two silicon atoms in the first bottom surface oxygen region 38a. In other words, the concentration of the first structure in the first bottom surface oxygen region 38a is higher than, for example, the concentration of the second structure in the first bottom surface oxygen region 38a.

The concentration of oxygen atoms bonded to four silicon atoms in the first bottom surface oxygen region 38a is higher than, for example, the concentration of oxygen atoms bonded to the carbon atom in the first bottom surface oxygen region 38a. In other words, the concentration of the first structure in the first bottom surface oxygen region 38a is higher than, for example, the concentration of the third structure in the first bottom surface oxygen region 38a.

The second bottom surface oxygen region 38b contains an oxygen atom bonded to four silicon atoms. The second bottom surface oxygen region 38b includes the first structure.

The concentration of oxygen atoms bonded to four silicon atoms in the second bottom surface oxygen region 38b is higher than, for example, the concentration of oxygen atoms bonded to two silicon atoms in the second bottom surface oxygen region 38b. In other words, the concentration of the first structure in the second bottom surface oxygen region 38b is higher than, for example, the concentration of the second structure in the second bottom surface oxygen region 38b.

The concentration of oxygen atoms bonded to four silicon atoms in the second bottom surface oxygen region 38b is higher than, for example, the concentration of oxygen atoms bonded to the carbon atom in the second bottom surface oxygen region 38b. In other words, the concentration of the first structure in the second bottom surface oxygen region 38b is higher than, for example, the concentration of the third structure in the second bottom surface oxygen region 38b.

The gate electrode 20 is provided in the trench 24. For example, the first gate electrode 20a is provided in the first trench 24a. For example, the second gate electrode 20b is provided in the second trench 24b.

The gate electrode 20 is a conductor. The gate electrode 20 is, for example, polycrystalline silicon containing p-type impurities or n-type impurities.

The gate insulating layer 16 is disposed between the gate electrode 20 and the silicon carbide layer 10. For example, the first gate insulating layer 16a is disposed between the first gate electrode 20a and the silicon carbide layer 10. For example, the second gate insulating layer 16b is disposed between the second gate electrode 20b and the silicon carbide layer 10.

The gate insulating layer 16 is disposed between the gate electrode 20 and the p-well region 30. For example, the first gate insulating layer 16a is disposed between the first gate electrode 20a and the p-well region 30. For example, the second gate insulating layer 16b is disposed between the second gate electrode 20b and the p-well region 30.

The gate insulating layer 16 is disposed between the gate electrode 20 and the side surface oxygen region 36. For example, the first gate insulating layer 16a is disposed between the first gate electrode 20a and the first side surface oxygen region 36a. For example, the second gate insulating layer 16b is disposed between the second gate electrode 20b and the second side surface oxygen region 36b.

The gate insulating layer 16 is, for example, an oxide or an oxynitride. The gate insulating layer 16 is, for example, a silicon oxide. The thickness of the gate insulating layer 16 is, for example, equal to or more than 30 nm and equal to or less than 200 nm.

The first gate insulating layer 16a and the first side surface oxygen region 36a are in contact with each other. The second gate insulating layer 16b and the second side surface oxygen region 36b are in contact with each other. The p-well region 30 between the first gate insulating layer 16a and the second gate insulating layer 16b serves as a channel region of the MOSFET 100.

The interlayer insulating layer 22 is formed on the gate electrode 20. The interlayer insulating layer 22 electrically separates the gate electrode 20 and the source electrode 12 from each other. The interlayer insulating layer 22 is, for example, a silicon oxide.

The source electrode 12 is disposed on the first face P1 side of the silicon carbide layer 10. The source electrode 12 is in contact with, for example, the source region 32 and the p-well contact region 34. The source electrode 12 is electrically connected to the source region 32 and the p-well contact region 34. The source electrode 12 also functions as a p-well electrode for applying an electric potential to the p-well region 30.

The source electrode 12 has, for example, a stacked structure of a barrier metal layer and a metal layer on the barrier metal layer. The barrier metal layer contains, for example, titanium nitride. The metal layer contains, for example, aluminum. The barrier metal layer and the metal layer may form an alloy by reaction.

The drain electrode 14 is disposed on the second face P2 side of the silicon carbide layer 10. The drain electrode 14 is in contact with, for example, the drain region 26. The drain electrode 14 is electrically connected to the drain region 26.

The drain electrode 14 is, for example, nickel. Nickel may react with the silicon carbide layer 10 to form nickel silicide. Nickel silicide is, for example, NiSi or $Ni_2Si$.

In addition, in the semiconductor device of the first embodiment, the n-type impurity is, for example, nitrogen or phosphorus. Arsenic (As) or antimony (Sb) can also be applied as an n-type impurity.

In addition, in the semiconductor device of the first embodiment, the p-type impurity is, for example, aluminum. Boron (B), gallium (Ga), and indium (In) can also be applied as p-type impurities.

Next, an example of a method for manufacturing the semiconductor device of the first embodiment will be described.

Figure 15:
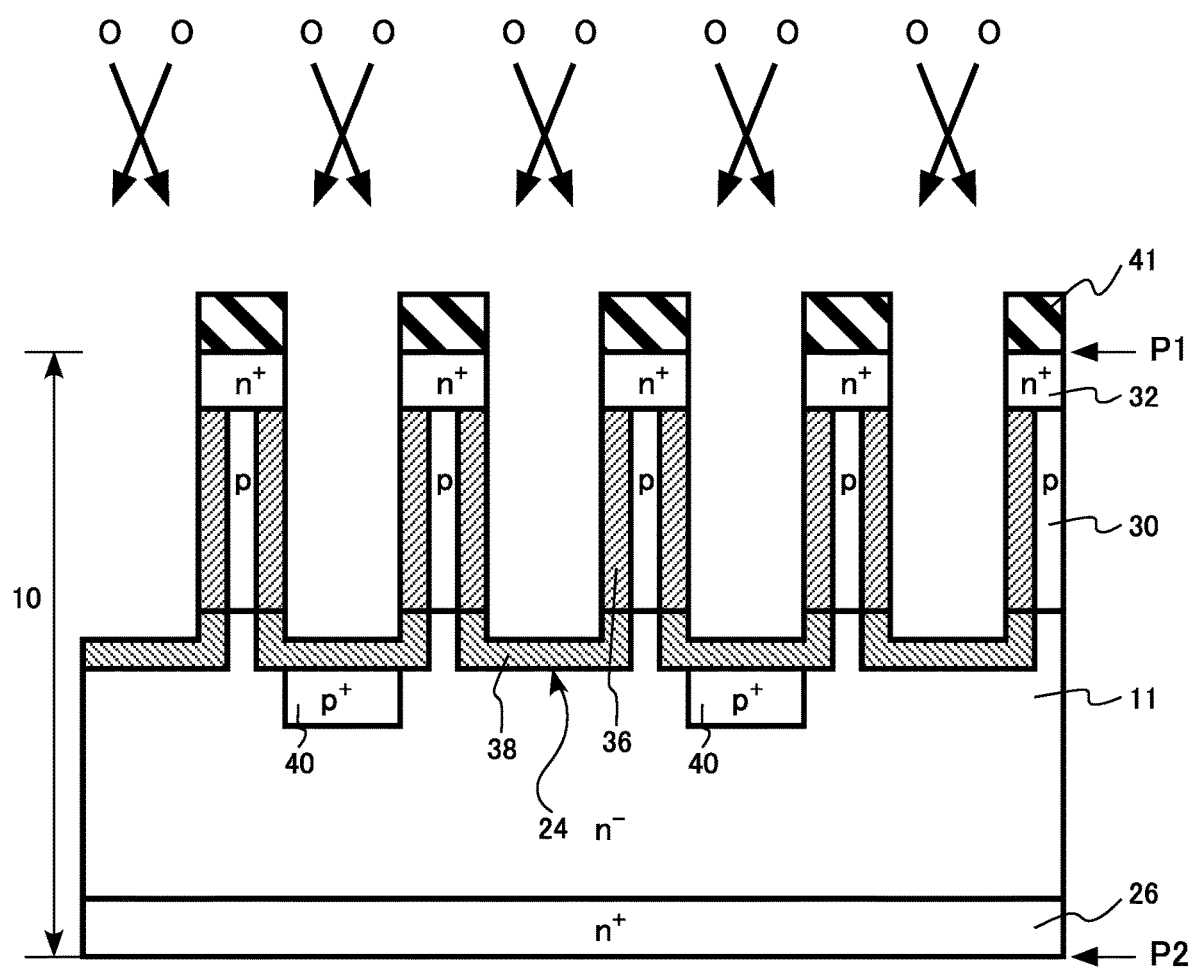
FIG. 15 is a diagram showing an example of the method for manufacturing the semiconductor device of the first embodiment.
Figure 16:
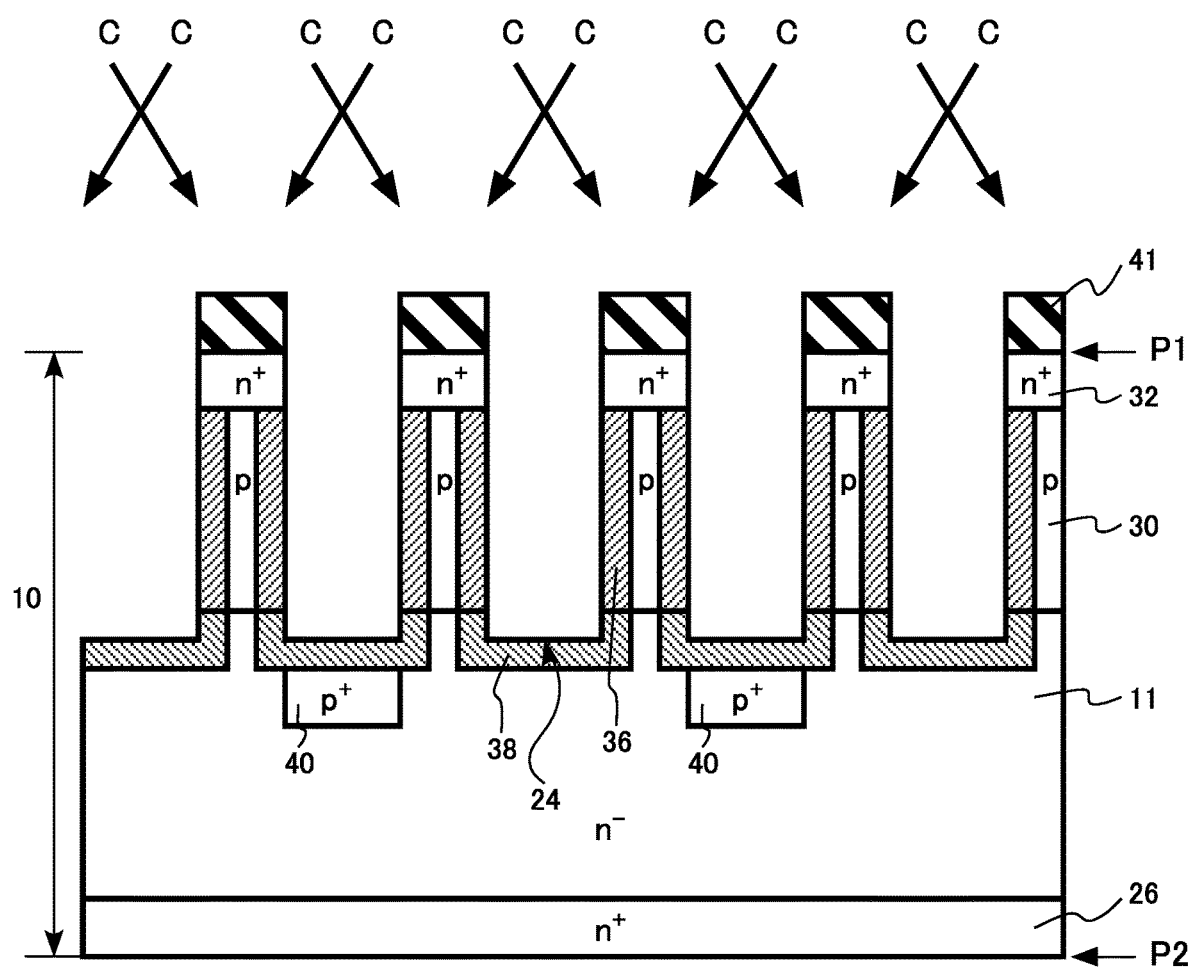
FIG. 16 is a diagram showing an example of the method for manufacturing the semiconductor device of the first embodiment.
Figure 17:
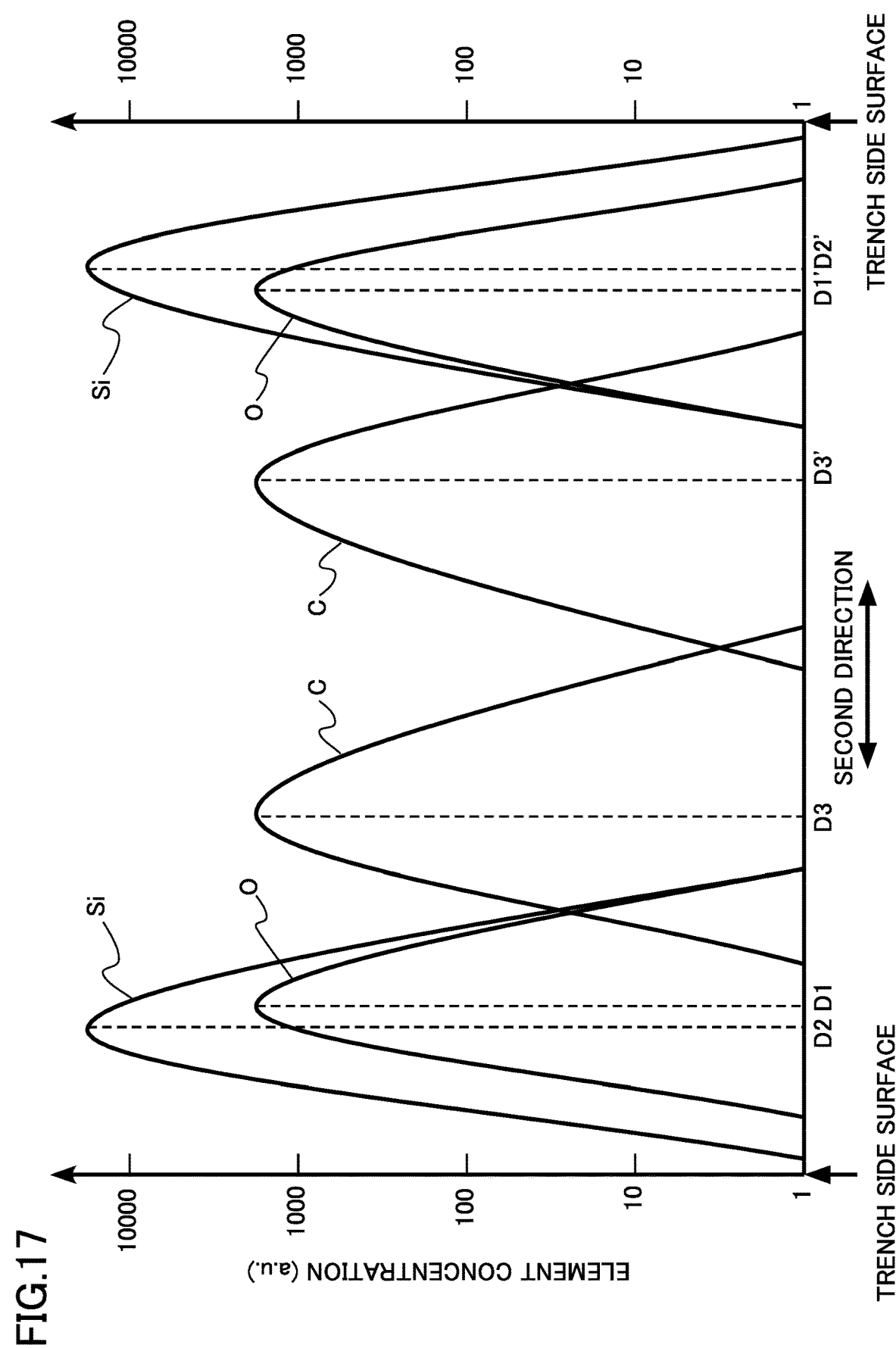
FIG. 17 is a diagram showing an example of the method for manufacturing the semiconductor device of the first embodiment.

FIGS. 10 to 19 are diagrams showing an example of a method for manufacturing the semiconductor device of the first embodiment. FIGS. 10 to 16, 18, and 19 show cross sections corresponding to FIG. 1. FIG. 17 shows the profile of ion implantation.

Figure 10:
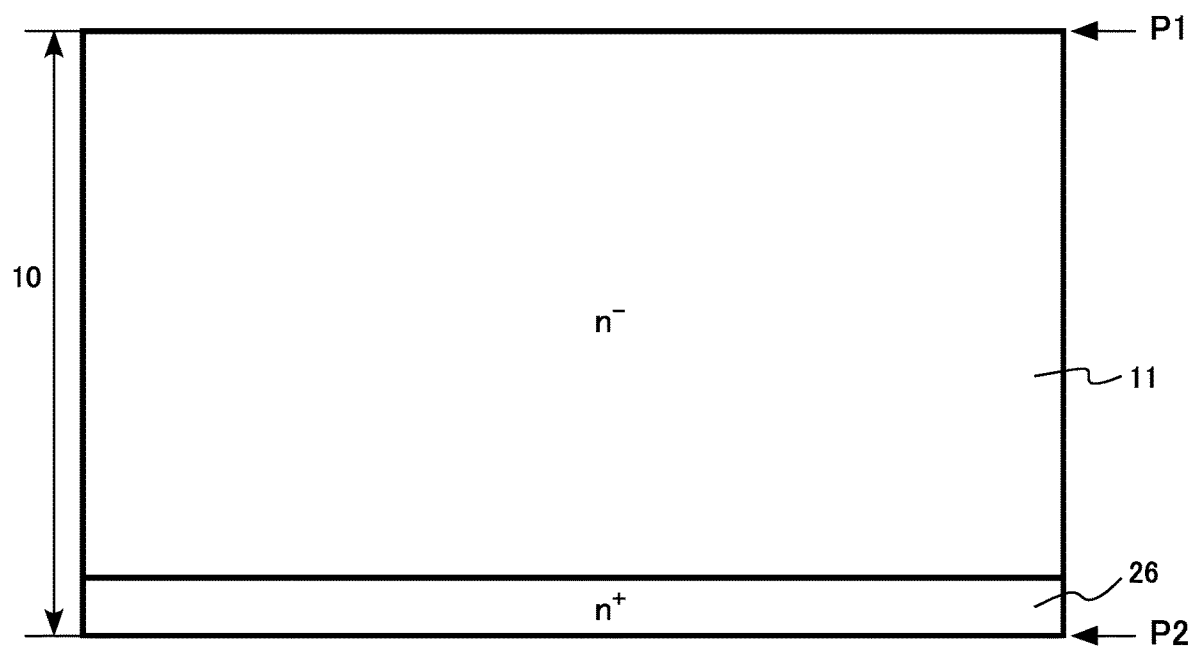
FIG. 10 is a diagram showing an example of a method for manufacturing the semiconductor device of the first embodiment.

First, the silicon carbide layer 10 having an n⁻-type silicon carbide region 11 formed on the drain region 26 is prepared (FIG. 10). The n⁻-type silicon carbide region 11 is formed by, for example, an epitaxial growth method. A part of the silicon carbide region 11 finally becomes an n⁻-type drift region 28.

Figure 11:
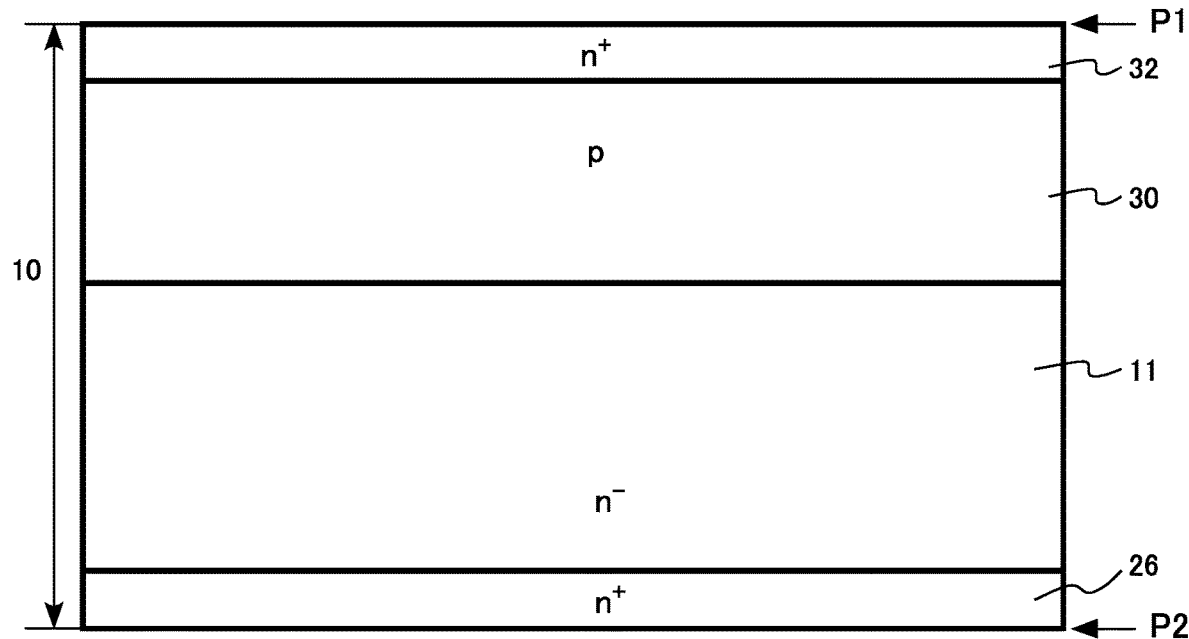
FIG. 11 is a diagram showing an example of the method for manufacturing the semiconductor device of the first embodiment.

Then, the p-well region 30, the source region 32, and the p-well contact region 34 (not shown) are formed in the silicon carbide region 11 by using a known lithography method and an ion implantation method (FIG. 11).

Then, a mask material 41 is formed on the silicon carbide layer 10. The mask material 41 is formed by using, for example, a known chemical vapor deposition method (CVD method), a lithography method, and a reactive ion etching method (RIE method).

Figure 12:
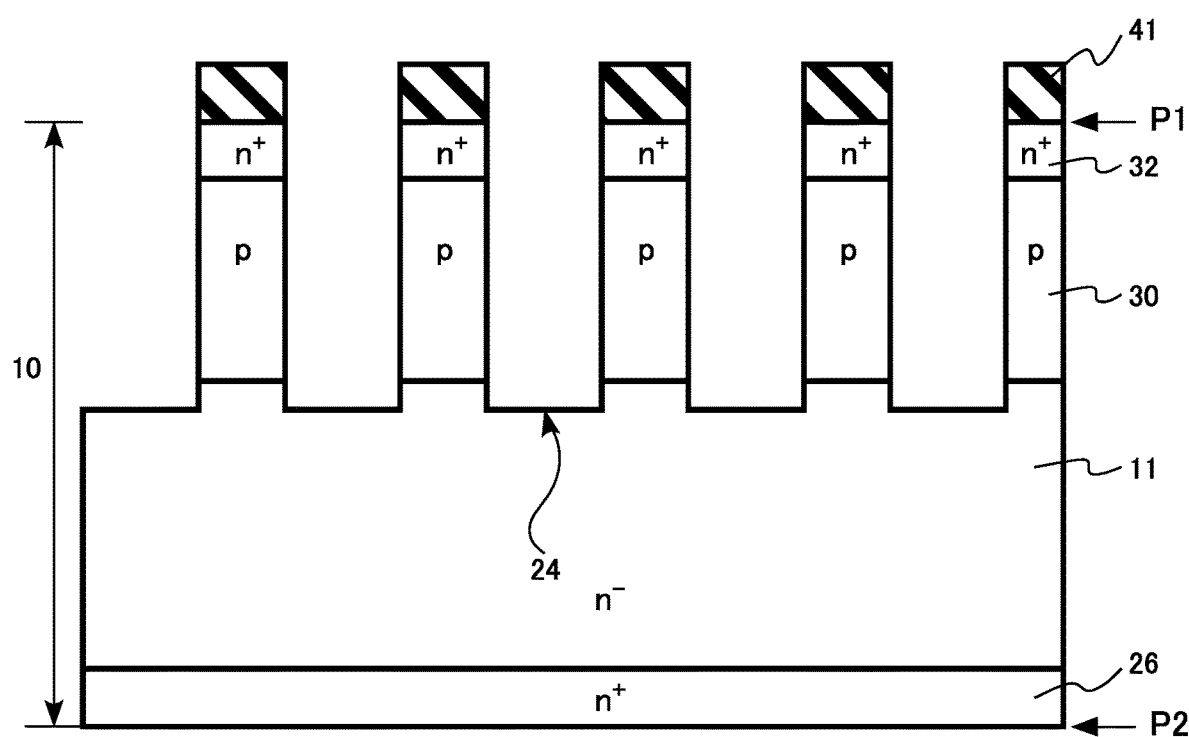
FIG. 12 is a diagram showing an example of the method for manufacturing the semiconductor device of the first embodiment.

Then, by using the mask material 41 as a mask, the trench 24 is formed (FIG. 12). The trench 24 is formed, for example, by using the RIE method.

Then, a photoresist layer 43 is formed. The photoresist layer 43 is formed so as to bury some of the trenches 24. The photoresist layer 43 is formed by using a lithography method.

Figure 13:
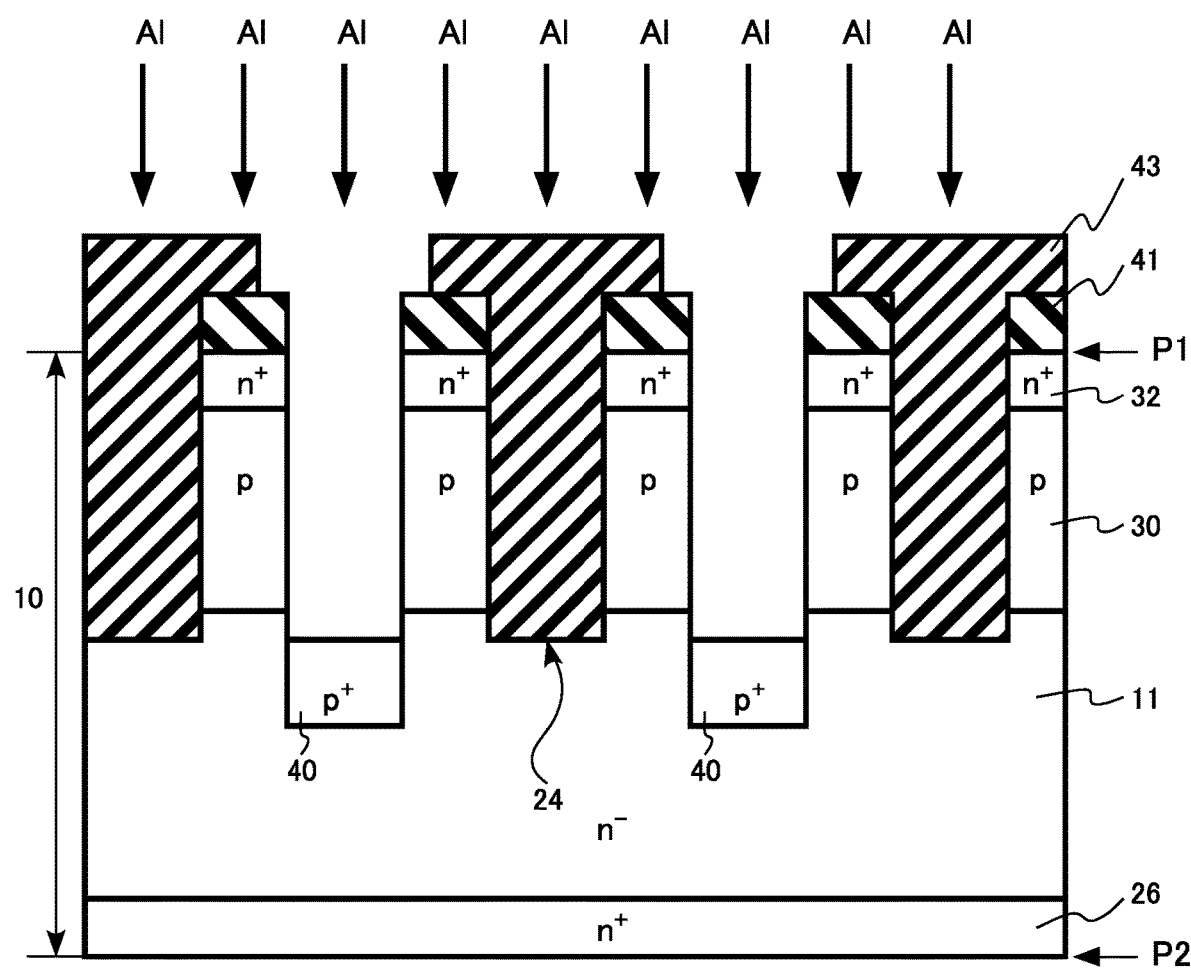
FIG. 13 is a diagram showing an example of the method for manufacturing the semiconductor device of the first embodiment.

Then, by using the photoresist layer 43 as a mask, aluminum is ion-implanted into the silicon carbide layer 10 by a known ion implantation method (FIG. 13). The p-bottom region 40 is formed at the bottoms of some of the trenches 24. Then, the photoresist layer 43 is removed.

Figure 14:
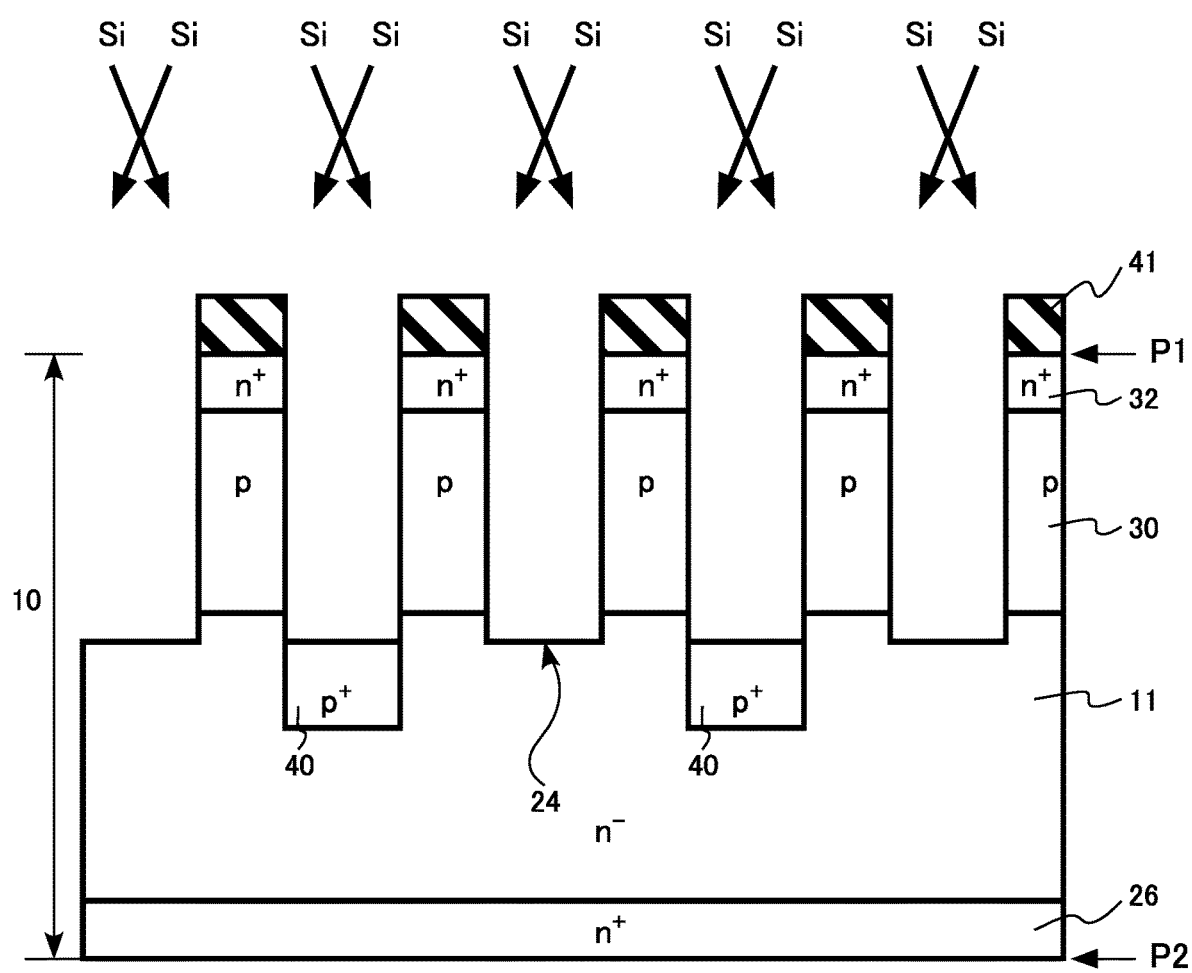
FIG. 14 is a diagram showing an example of the method for manufacturing the semiconductor device of the first embodiment.

Then, by using the mask material 41 as a mask, silicon is ion-implanted into the silicon carbide layer 10 by a known ion implantation method (FIG. 14). Silicon is ion-implanted into the side and bottom surfaces of the trench 24. For silicon ion implantation, for example, an oblique ion implantation method is used.

Then, oxygen is ion-implanted into the silicon carbide layer 10 by a known ion implantation method to form the side surface oxygen region 36 and the bottom surface oxygen region 38 (FIG. 15). The side surface oxygen region 36 is formed on the side surface of the trench 24, and the bottom surface oxygen region 38 is formed on the bottom surface of the trench 24. For oxygen ion implantation, for example, an oblique ion implantation method is used.

The oxygen ion implantation breaks the carbon bonds in the silicon carbide layer 10, so that the carbon vacancy in the silicon carbide layer 10 increases.

The crystal structure in the vicinity of the surface of the silicon carbide layer 10 is disturbed by the ion implantation of silicon. By the silicon ion implantation, for example, the vicinity of the surface of the silicon carbide layer 10 is amorphized.

By performing the silicon ion implantation before the oxygen ion implantation, channeling during the oxygen ion implantation is suppressed. Therefore, it is possible to prevent the side surface oxygen region 36 or the bottom surface oxygen region 38 from becoming deep. In addition, it is also possible to perform the silicon ion implantation after the oxygen ion implantation.

Then, carbon is ion-implanted into the silicon carbide layer 10 by a known ion implantation method (FIG. 16). Carbon is ion-implanted into the side and bottom surfaces of the trench 24.

FIG. 17 shows the profile of ion implantation of oxygen (O), silicon (Si), and carbon (C). FIG. 17 shows the ion implantation profile of the silicon carbide layer 10 between the two trenches 24. The horizontal axis indicates the distance of the silicon carbide layer 10 from the side surface of the trench 24 in the second direction, and the vertical axis indicates the element concentration.

In FIG. 17, after ion implantation, the distance from one trench side surface at which the oxygen concentration is maximized is assumed to be a first distance D1, the distance at which the silicon concentration is maximized is assumed to be a second distance D2, and the distance at which the carbon concentration is maximized is assumed to be a third distance D3. In addition, the distance from the other trench side surface at which the oxygen concentration is maximized is assumed to be a first distance D1', the distance at which the silicon concentration is maximized is assumed to be a second distance D2', and the distance at which the carbon concentration is maximized is assumed to be a third distance D3'.

The first distance D1 and the second distance D2 are smaller than the third distance D3. The first distance D1 and the second distance D2 are, for example, equal to or less than 15 nm. The first distance D1 and the second distance D2 are, for example, equal to or less than 10 nm. The first distance D1 and the second distance D2 are, for example, equal to or less than 5 nm. The third distance D3 is, for example, equal to or more than 10 nm and equal to or less than 30 nm. The difference between the first distance D1 and the second distance D2 is, for example, equal to or less than 2 nm.

Similarly, the first distance D1' and the second distance D2' are smaller than the third distance D3'. The first distance D1' and the second distance D2' are, for example, equal to or less than 15 nm. The first distance D1' and the second distance D2' are, for example, equal to or less than 10 nm. The first distance D1' and the second distance D2' are, for example, equal to or less than 5 nm. The third distance D3' is, for example, equal to or more than 10 nm and equal to or less than 30 nm. The difference between the first distance D1' and the second distance D2' is, for example, equal to or less than 2 nm.

For example, the silicon ion implantation profile covers the entire oxygen ion implantation profile. Since silicon is present in the vicinity, it becomes easy for the oxygen to enter the carbon site of the crystal structure of silicon carbide.

For example, the carbon ion implantation profile is positioned well behind the oxygen ion implantation profile. The presence of carbon fills the carbon vacancies, which makes it difficult for oxygen to diffuse. Therefore, the diffusion of oxygen from the side surface of the trench in the depth direction is suppressed.

Figure 18:
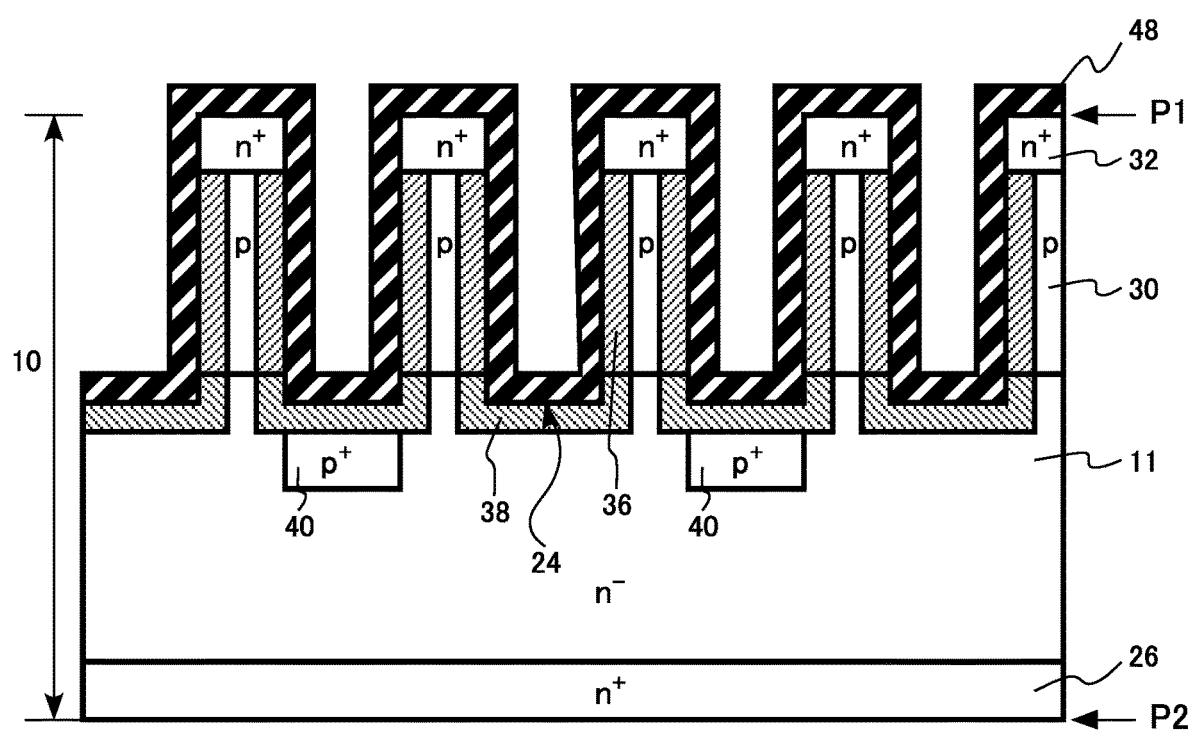
FIG. 18 is a diagram showing an example of the method for manufacturing the semiconductor device of the first embodiment.

Then, the mask material 41 is removed, and then a carbon film 48 is formed on the surface of the silicon carbide layer 10 and the inner surface of the trench 24. Then, heat treatment is performed to activate the elements introduced by ion implantation into the silicon carbide layer 10 (FIG. 18). By the heat treatment, oxygen atoms fill a large number of carbon vacancies formed in the vicinity of the inner surface of the trench 24. In other words, an oxygen atom bonded to four silicon atoms is formed. In other words, a large number of first structures are formed in which the carbon atom in the crystal structure of silicon carbide is substituted by one oxygen atom.

During the heat treatment, oxygen is present as atoms in the side surface oxygen region 36 and the bottom surface oxygen region 38. Therefore, the formation of the first structure in which the carbon atom in the crystal structure of silicon carbide is substituted by one oxygen atom is promoted rather than the formation of the second structure in which the carbon atom is substituted by two oxygen atoms.

During the heat treatment, silicon atoms are present in the side surface oxygen region 36 and the bottom surface oxygen region 38. Therefore, the formation of the first structure in which the carbon atom in the crystal structure of silicon carbide is substituted by one oxygen atom is promoted rather than the formation of the third structure in which the silicon atom in the crystal structure of silicon carbide is substituted by one oxygen atom.

In addition, during the heat treatment, the carbon concentration is higher than the oxygen concentration in a region deeper than the side surface oxygen region 36 and the bottom surface oxygen region 38. Therefore, since the carbon atom enters the carbon vacancy in the region deeper than the side surface oxygen region 36 and the bottom surface oxygen region 38 in preference to the oxygen atom, the first structure is difficult to be formed.

Figure 19:
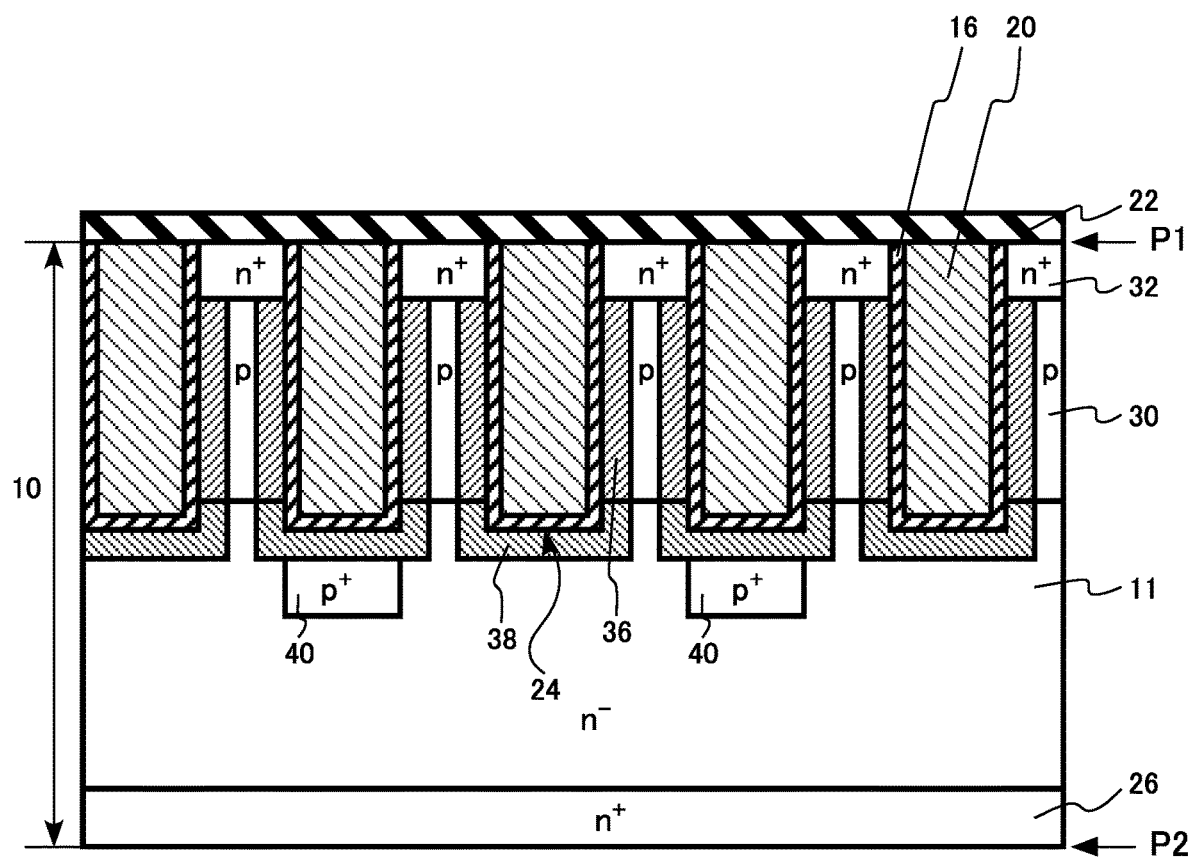
FIG. 19 is a diagram showing an example of the method for manufacturing the semiconductor device of the first embodiment.

Then, the carbon film 48 is removed, and then the gate insulating layer 16 and the gate electrode 20 are formed on the surface of the silicon carbide layer 10 by using a known process technique. The gate insulating layer 16 and the gate electrode 20 are formed by using, for example, a CVD method. In addition, the interlayer insulating layer 22 is formed on the gate electrode 20 by using a known process technique (FIG. 19).

During the heat treatment, excess carbon or silicon in the silicon carbide layer 10 is absorbed by the carbon film 48. By removing the carbon film 48, excess carbon or silicon can be removed. In this manner, the excess carbon or silicon in the silicon carbide layer 10 can be removed. Therefore, even if a large amount of carbon or silicon is ion-implanted to form the first structure, the characteristics of the MOSFET 100 are not degraded.

Then, the source electrode 12 and the drain electrode 14 are formed by using a known process technique. By the manufacturing method described above, the MOSFET 100 shown in FIG. 1 is manufactured.

Next, the function and effect of the semiconductor device of the first embodiment will be described.

In a MOSFET to which a trench gate structure is applied, the distance between adjacent trenches is reduced in order to reduce the on-resistance per unit area. By increasing the channel area per unit area, the on-resistance per unit area is reduced.

However, as the distance between the trenches decreases, the potential of the p-well region interposed between the two gate electrodes decreases. For this reason, the threshold voltage is reduced, and the cutoff characteristic of the MOSFET is degraded. For example, if the p-type impurity concentration in the p-well region is increased in order to increase the threshold voltage, the scattering of carrier electrons by the p-type impurities increases, so that the mobility of electrons decreases. Therefore, the on-resistance of the MOSFET 100 increases.

In the MOSFET 100 of the first embodiment, the side surface oxygen region 36 is provided between the gate insulating layer 16 and the p-well region 30. By providing the side surface oxygen region 36, a high threshold voltage and high mobility are realized in the MOSFET 100. The details will be described below.

Figure 20:
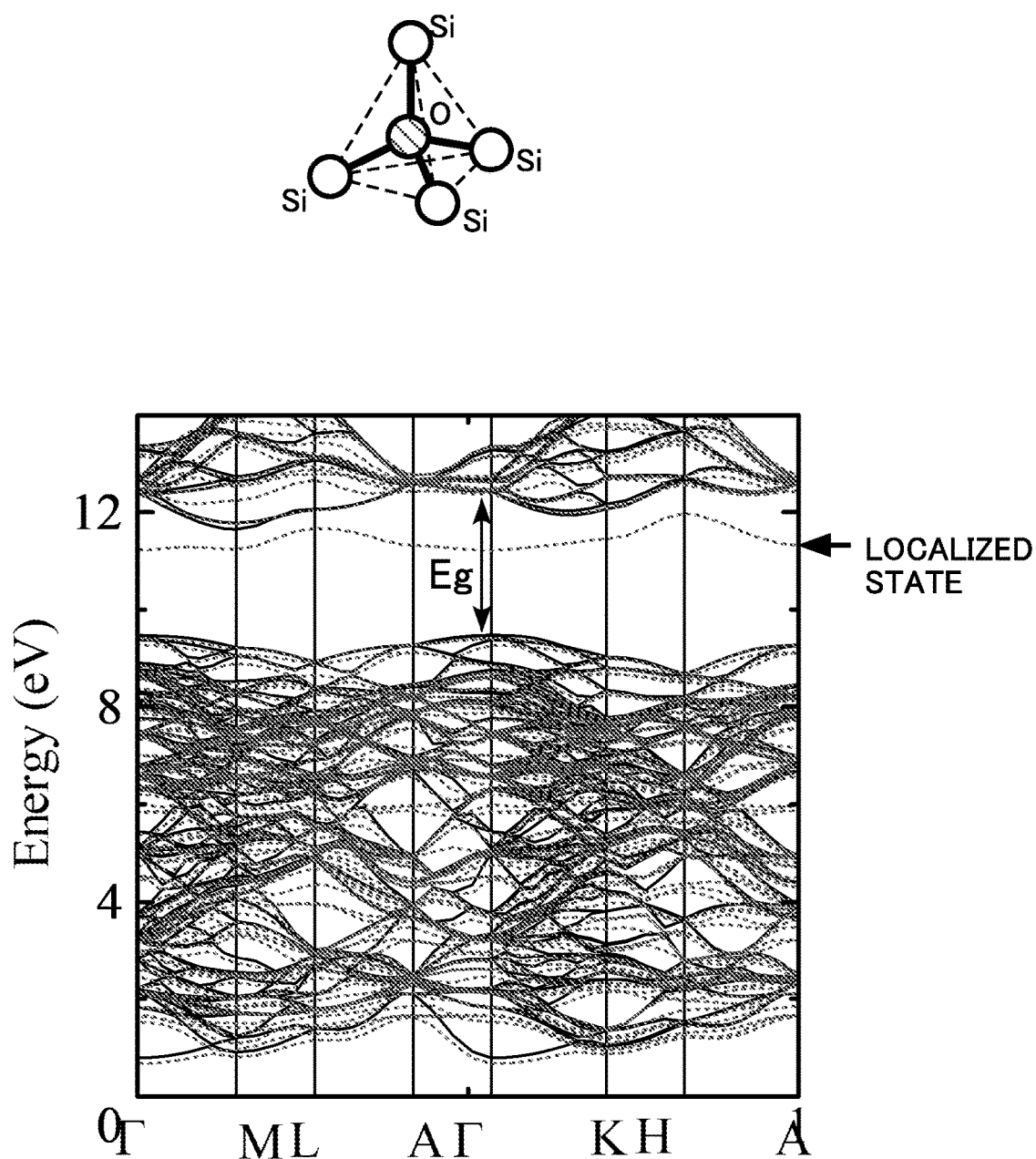
FIG. 20 is a diagram showing an electron state of the semiconductor device of the first embodiment.

FIG. 20 is a diagram showing an electron state of the semiconductor device of the first embodiment. The electron state when one oxygen atom is present at the position (carbon site) of the carbon atom in the crystal structure of silicon carbide is obtained by first-principle calculation. That is, the electron state when the first structure containing the oxygen atom bonded to the four silicon atoms is present in the silicon carbide is obtained by the first-principle calculation.

As shown in FIG. 20, when an oxygen atom is present at the carbon site, a level is formed at a deep position away from the lower end of the conduction band. When an oxygen atom is present at the carbon site, a localized state is formed at a deep position away from the lower end of the conduction band.

The localized state is formed at a position of about 0.8 eV from the lower end of the conduction band. The energy difference between the localized state and the lower end of the conduction band is, for example, equal to or more than 0.7 eV and equal to or less than 1.0 eV.

The first structure is present in the side surface oxygen region 36 of the MOSFET 100 of the first embodiment. Therefore, a deep level is formed in the side surface oxygen region 36.

Figure 21A:
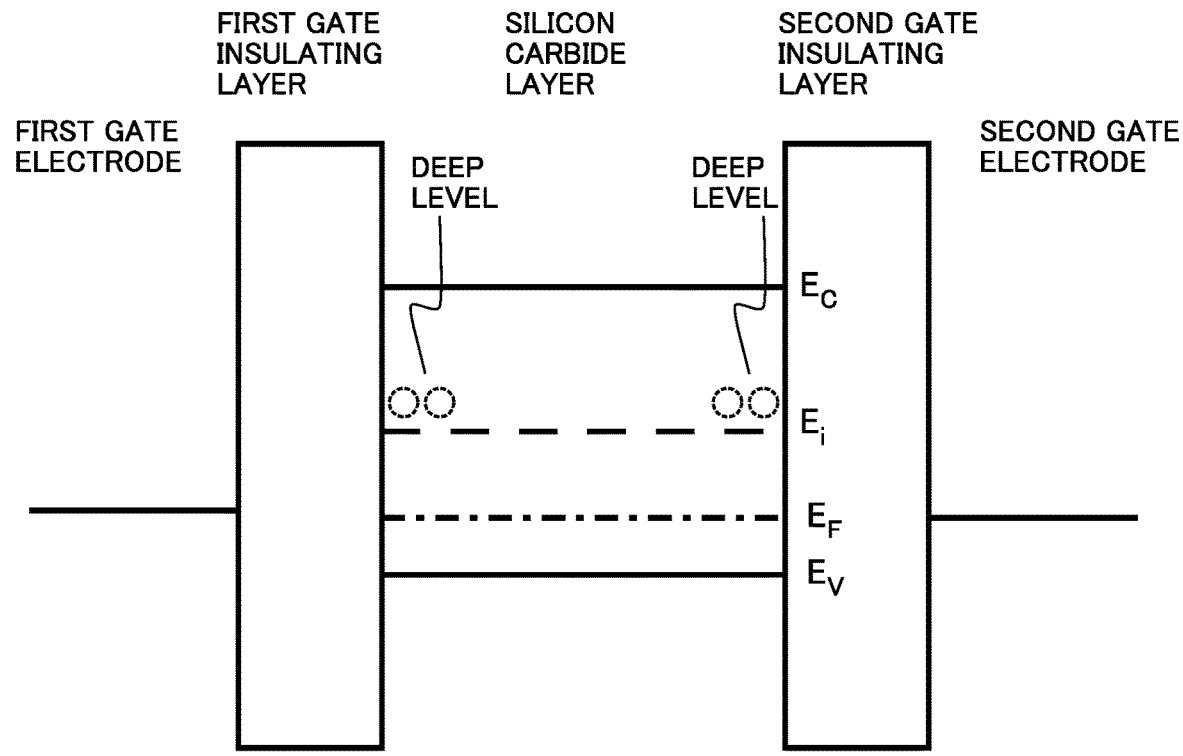
FIGS. 21A and 21B are explanatory diagrams of the function and effect of the semiconductor device of the first embodiment.
Figure 21B:
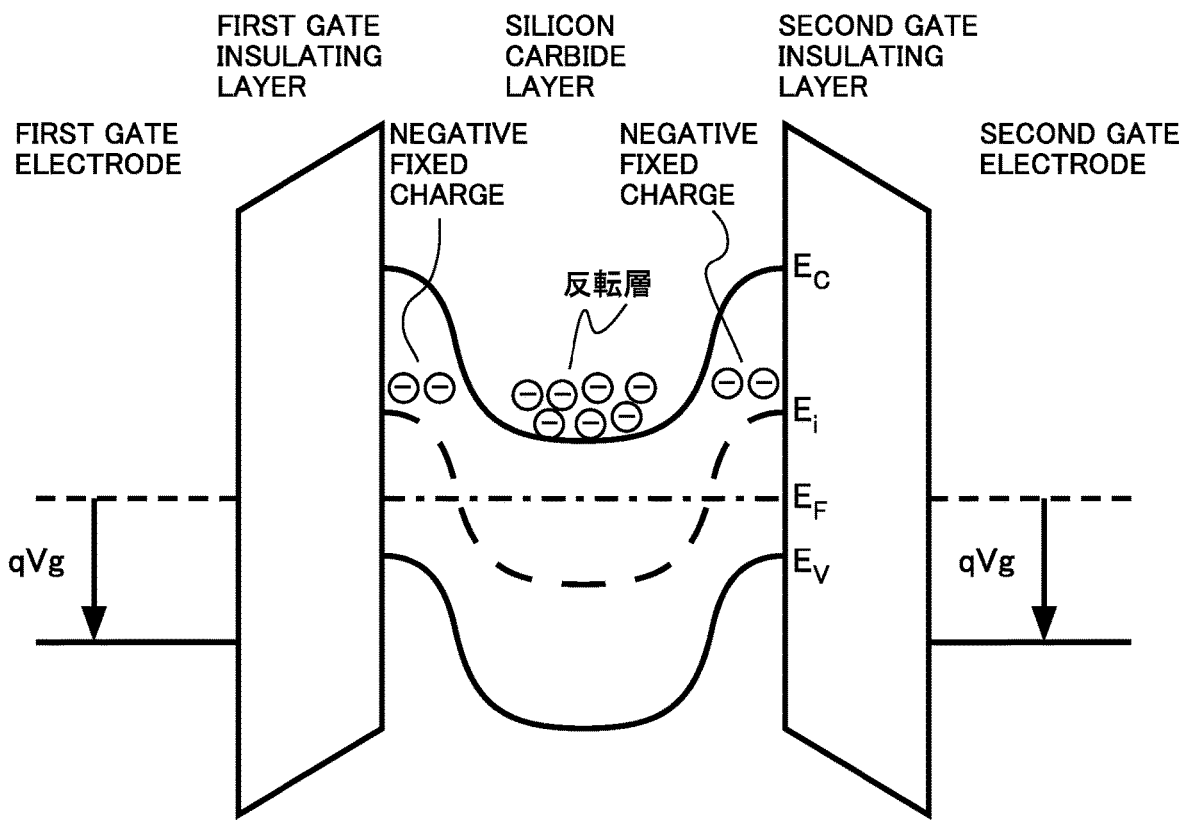

FIGS. 21A and 21B are explanatory diagrams of the function and effect of the semiconductor device of the first embodiment. FIGS. 21A and 21B are band diagrams of the MOS structure of the MOSFET 100. FIGS. 21A and 21B show a portion between the first trench 24a and the second trench 24b. FIGS. 21A and 21B show a portion between the first gate electrode 20a and the second gate electrode 20b.

FIG. 21A is a band diagram of a flat band state in which no voltage is applied between the source electrode 12 and the gate electrode 20. FIG. 21B is a band diagram of a state in which a positive voltage (Vg in FIG. 21B) is applied to the gate electrode 20 to form an inversion layer. In addition, FIGS. 21A and 21B show an ideal case where the work function of the gate electrode 20 and the Fermi level of the silicon carbide layer 10 are equal.

As shown in FIG. 21A, a deep level formed by oxygen atoms entering the carbon site is present in the vicinity of the interface between the silicon carbide layer 10 and the gate insulating layer 16. As shown in FIG. 21B, when a positive voltage is applied to the gate electrode 20, the potential in the vicinity of the interface decreases.

When the potential in the vicinity of the interface decreases, electrons are induced, but these electrons are trapped in deep levels to form negative fixed charges as shown in FIG. 21B. Since negative fixed charges are formed in the vicinity of the interface, the threshold voltage of the MOSFET 100 increases. According to the MOSFET 100, it is possible to increase the threshold voltage without increasing the p-type impurity concentration in the p-well region 30. Therefore, it is possible to increase the threshold voltage without increasing the on-resistance.

According to the MOSFET 100, it is possible to reduce the distance between the trench 24 and the trench 24 without reducing the threshold voltage. Therefore, it is possible to reduce the on-resistance per unit area.

From the viewpoint of reducing the on-resistance per unit area of the MOSFET 100, the distance between the trench 24 and the trench 24 is preferably equal to or less than 80 nm, more preferably equal to or less than 50 nm. For example, the distance (d in FIG. 6) between the first trench 24a and the second trench 24b in the second direction is preferably equal to or less than 80 nm, more preferably equal to or less than 50 nm.

When the distance d between the first trench 24a and the second trench 24b in the second direction is equal to or less than 100 nm, the channel vertical components of the electric field from the gate electrodes on both sides cancel each other out near the center of the silicon carbide layer 10 having a width d (distance d). When the width d is equal to or less than 80 nm, the channel vertical components of the electric field in a region of about 50% from the center of the silicon carbide layer 10 cancel each other out. When the width d is equal to or less than 50 nm, the channel vertical components of the electric field in a region of approximately 100% of the silicon carbide layer 10 cancel each other out. The channel vertical component of the electric field from the electrode causes electrons to deviate from the channel, resulting in a decrease in mobility. Since the channel vertical components of the electric field are canceled out, high mobility is realized. Therefore, the distance d between the first trench 24a and the second trench 24b in the second direction is preferably equal to or less than 100 nm, more preferably equal to or less than 80 nm, and even more preferably equal to or less than 50 nm.

On the other hand, an oxygen region is formed in the vicinity of the interface between the gate insulating layer 16 and the silicon carbide layer 10. Therefore, it is desirable that the silicon carbide layer 10 between the trench 24 and the trench 24 has a width of at least 15 nm or more. Considering the ease of forming the oxygen region, the distance d between the first trench 24a and the second trench 24b in the second direction is preferably equal to or more than 20 nm, more preferably equal to or more than 25 nm.

From the viewpoint of facilitating the formation of the gate insulating layer 16 and the gate electrode 20 in the trench 24, the width of the trench 24 in the second direction is preferably larger than the distance between the trench 24 and the trench 24. For example, the width (w in FIG. 6) of the first trench 24a in the second direction is preferably larger than the distance d between the first trench 24a and the second trench 24b in the second direction. The width w of the first trench 24a in the second direction is preferably 1.5 times or more the distance d between the first trench 24a and the second trench 24b in the second direction, more preferably twice or more the distance d between the first trench 24a and the second trench 24b in the second direction.

When a negative fixed charge is formed in the vicinity of the interface, the potential in the vicinity of the interface increases. Therefore, as shown in FIG. 21B, an inversion layer is formed at a deep position away from the vicinity of the interface. A so-called buried channel is formed.

When a buried channel is formed, electrons flow at a position away from the vicinity of the interface. Therefore, interfacial scattering of electrons is suppressed, and the mobility of the MOSFET 100 is increased. As a result, the on-resistance of the MOSFET 100 can be reduced.

The carbon vacancies in the silicon carbide layer 10 form a shallow level close to the lower end of the conduction band. Due to this shallow level, the mobility of the MOSFET 100 is decreased. In the MOSFET 100, the amount of carbon vacancies is reduced by filling the carbon vacancies with oxygen contained in the side surface oxygen region 36. Therefore, the mobility of the MOSFET 100 increases.

In addition, when carbon vacancies are present in the silicon carbide layer, the surface of the silicon carbide layer is easily oxidized. When the surface of the silicon carbide layer is oxidized, carbon vacancies are further formed. When the surface of the silicon carbide layer is oxidized, carbon vacancies due to carbon diffused in the gate insulating layer are generated. For this reason, the mobility of the MOSFET is decreased or the reliability of the gate insulating layer is reduced.

In the MOSFET 100, the amount of carbon vacancies is reduced by filling the carbon vacancies with oxygen contained in the side surface oxygen region 36. Therefore, the oxidation resistance of the surface of the silicon carbide layer 10 is improved. Therefore, the amount of carbon vacancies in the silicon carbide layer 10 and the amount of carbon diffused in the gate insulating layer 16 are reduced. As a result, the mobility of the MOSFET 100 increases. At the same time, the reliability of the gate insulating layer 16 is improved.

The oxygen concentration at the first position X1 and the second position X2 20 nm away from the interface between the gate insulating layer 16 and the silicon carbide layer 10 toward the silicon carbide layer 10 is preferably less than $1 \times 10^{17}$ cm$^{-3}$, more preferably less than $1 \times 10^{16}$ cm$^{-3}$, and even more preferably less than $1 \times 10^{15}$ cm$^{-3}$, for example. When the oxygen concentration at the first position X1 and the second position X2 is lower than the above upper limit value, the buried channel approaches the interface between the gate insulating layer 16 and the silicon carbide layer 10. When the buried channel approaches the interface between the gate insulating layer 16 and the silicon carbide layer 10, the controllability of the MOSFET 100 by the gate voltage is improved.

By improving the controllability of the MOSFET 100 by the gate voltage, for example, the operating voltage of the MOSFET 100 can be reduced. As a result, for example, the leakage current of the gate insulating layer is reduced. In addition, the leakage current between the source and the drain is reduced. In addition, the short channel effect can be suppressed.

The oxygen concentration in the side surface oxygen region 36 is preferably equal to or more than $1 \times 10^{17}$ cm$^{-3}$, more preferably equal to or more than $2 \times 10^{18}$ cm$^{-3}$, even more preferably equal to or more than $3 \times 10^{19}$ cm$^{-3}$, even more preferably equal to or more than $3 \times 10^{20}$ cm$^{-3}$, and even more preferably equal to or more than $3 \times 10^{21}$ cm$^{-3}$. By exceeding the above lower limit, the threshold voltage and mobility of the MOSFET 100 become higher.

For example, when the oxygen concentration in the side surface oxygen region 36 is equal to or more than $3 \times 10^{19}$ cm$^{-3}$, the threshold voltage is about 1 V higher than that in a case where the side surface oxygen region 36 is not present. In addition, when the oxygen concentration in the side surface oxygen region 36 is equal to or more than $3 \times 10^{20}$ cm$^{-3}$, the threshold voltage is about 5 V higher than that in a case where the side surface oxygen region 36 is not present.

The oxygen concentration in the side surface oxygen region 36 is preferably equal to or less than $1 \times 10^{23}$ cm$^{-3}$, more preferably equal to or less than $5 \times 10^{22}$ cm$^{-3}$, even more preferably equal to or less than $1 \times 10^{22}$ cm$^{-3}$, and even more preferably equal to or less than $5 \times 10^{21}$ cm$^{-3}$. By falling below the above upper limit, the amount of oxygen atoms entering the silicon site or the amount of oxygen atoms disposed between the lattices of silicon carbide is reduced, so that the mobility of the MOSFET 100 becomes higher.

If the oxygen concentration in the side surface oxygen region 36 is higher than $1 \times 10^{23}$ cm$^{-3}$, the interfacial potential may rise significantly and the threshold voltage may become too high. For this reason, it may be difficult to turn on the MOSFET 100 by the gate voltage. From the viewpoint of setting the threshold voltage of the MOSFET 100 to an appropriate value, the oxygen concentration in the side surface oxygen region 36 is preferably equal to or less than $1 \times 10^{23}$ cm$^{-3}$, more preferably equal to or less than $5 \times 10^{22}$ cm$^{-3}$, even more preferably equal to or less than $1 \times 10^{22}$ cm$^{-3}$, and most preferably equal to or less than $5 \times 10^{21}$ cm$^{-3}$.

The concentration of oxygen atoms bonded to four silicon atoms in the side surface oxygen region 36 is preferably higher than the concentration of oxygen atoms bonded to two silicon atoms in the side surface oxygen region 36. In other words, the concentration of the first structure in the side surface oxygen region 36 is preferably higher than the concentration of the second structure in the side surface oxygen region 36. It is possible to form many deep levels at which a negative fixed charge can be formed. Therefore, the threshold voltage and mobility of the MOSFET 100 become higher.

The concentration of oxygen atoms bonded to four silicon atoms in the side surface oxygen region 36 is preferably higher than the concentration of oxygen atoms bonded to the carbon atom in the side surface oxygen region 36. In other words, the concentration of the first structure in the side surface oxygen region 36 is preferably higher than the concentration of the third structure in the side surface oxygen region 36. It is possible to form many deep levels at which a negative fixed charge can be formed. Therefore, the threshold voltage and mobility of the MOSFET 100 become higher.

From the viewpoint of increasing the threshold voltage and mobility of the MOSFET 100, it is preferable that the oxygen concentration in the side surface oxygen region 36 is higher than the aluminum concentration in the side surface oxygen region 36.

In the MOSFET 100 of the first embodiment, the bottom surface oxygen region 38 is provided between the trench 24 and the drift region 28. By having the bottom surface oxygen region 38, the effective film thickness of the gate insulating layer 16 at the bottom of the trench 24 of the MOSFET 100 increases. Therefore, the electric field is concentrated, and the dielectric breakdown tolerance of the gate insulating layer 16 at the bottom of the trench 24 where dielectric breakdown is likely to occur is improved. Therefore, the reliability of the gate insulating layer 16 is improved. In addition, the leakage current of the gate insulating layer 16 at the bottom of the trench 24 is reduced.

When a short circuit occurs in a load driven by using the MOSFET, a large current flows through the MOSFET and accordingly the MOSFET breaks down. The time taken for the MOSFET to break down is called a short-circuit tolerance. In order to suppress the breakdown of the MOSFET, it is desirable to increase the short-circuit tolerance. For example, by reducing the saturation current of the MOSFET, the short-circuit tolerance can be increased.

In the MOSFET 100 of the first embodiment, the p-bottom region 40 is provided at the bottoms of some of the trenches 24. In the MOSFET 100, when a high voltage is applied to the drain electrode 14, the current path between the trench 24 and the trench 24 is blocked by a depletion layer extending from the p-bottom region 40 to the drift region 28. Therefore, it is possible to increase the short-circuit tolerance of the MOSFET 100.

In addition, in the MOSFET 100, the p-bottom region 40 is not provided at the bottoms of some of the trenches 24. Therefore, it is possible to suppress excessive blockage of the current path during the normal ON operation of the MOSFET 100. As a result, it is possible to suppress an increase in the on-resistance of the MOSFET 100. By adjusting the ratio between the trench 24 having the p-bottom region 40 at its bottom and the trench 24 having no p-bottom region 40 at its bottom, it is possible to adjust the short-circuit tolerance and the on-resistance.

As described above, according to the semiconductor device of the first embodiment, the MOSFET having reduced on-resistance is provided.

Second Embodiment

A semiconductor device of a second embodiment is different from the semiconductor device of the first embodiment in that the silicon carbide layer further includes: a tenth silicon carbide region provided between the first trench and the first silicon carbide region, provided between the second trench and the first silicon carbide region, provided between the second silicon carbide region and the first silicon carbide region, in contact with the second silicon carbide region, and extending in the second direction; and an eleventh silicon carbide region provided between the first trench and the first silicon carbide region, provided between the second trench and the first silicon carbide region, provided between the second silicon carbide region and the first silicon carbide region, in contact with the second silicon carbide region, extending in the second direction, and separated from the tenth silicon carbide region in the first direction. Hereinafter, the description of a part of the content overlapping the first embodiment may be omitted.

Figure 22:
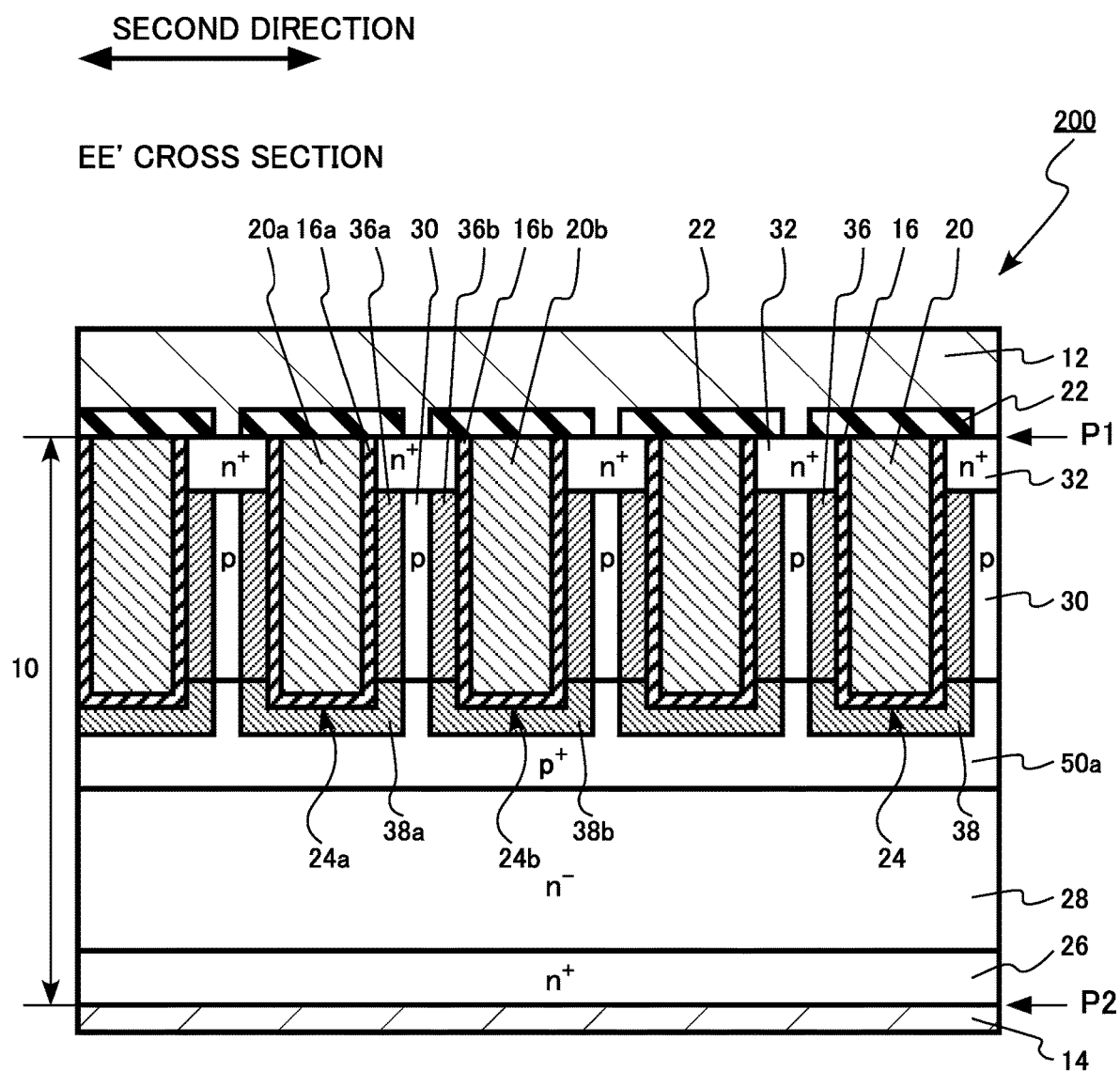
FIG. 22 is a schematic cross-sectional view of a semiconductor device of a second embodiment.

FIG. 22 is a schematic cross-sectional view of the semiconductor device of the second embodiment. The semiconductor device of the second embodiment is a trench gate type vertical MOSFET 200 having a gate electrode in a trench. The MOSFET 200 is an n-channel transistor having electrons as carriers.

Figure 23:
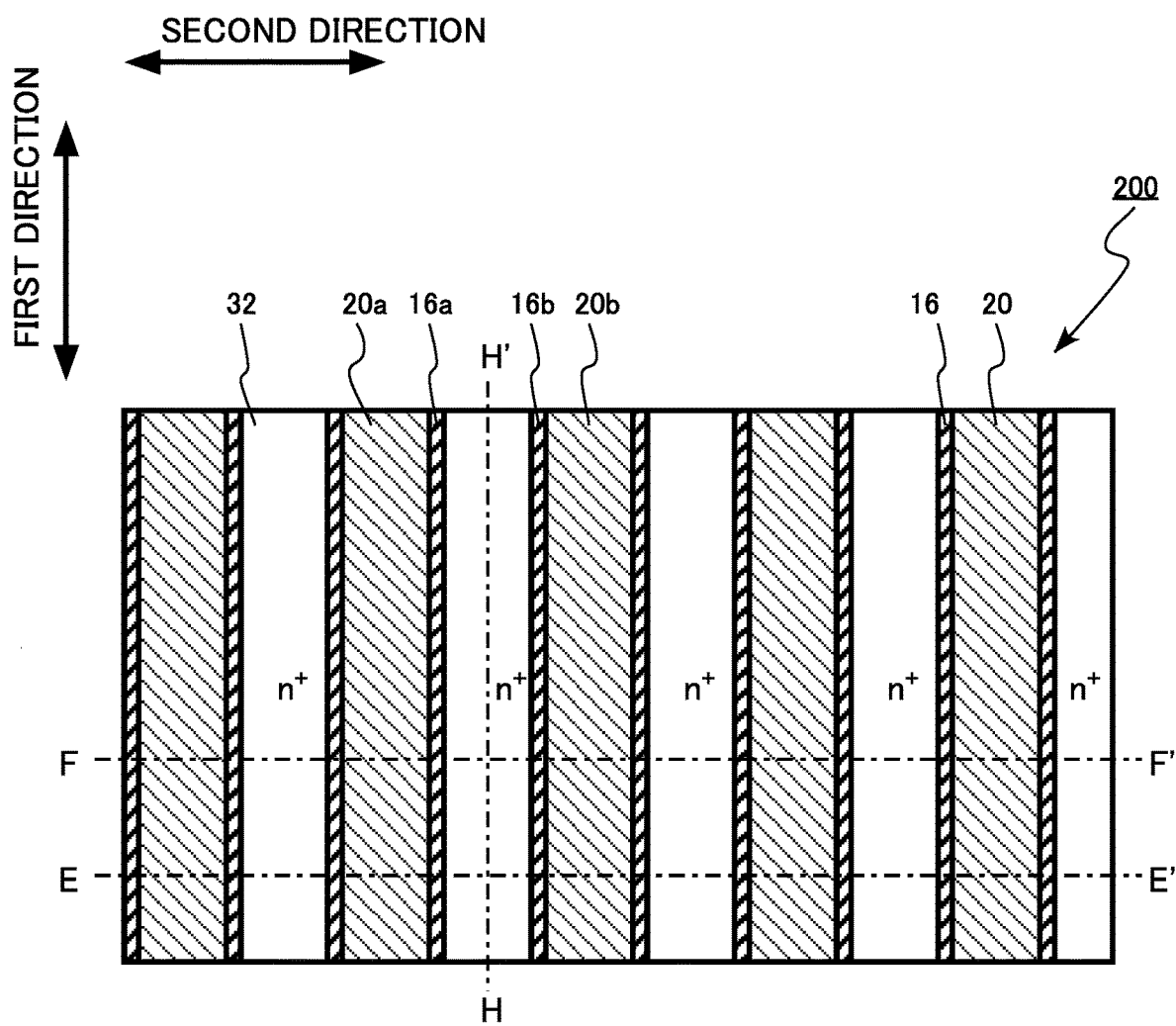
FIG. 23 is a schematic top view of the semiconductor device of the second embodiment.

FIG. 23 is a schematic top view of the semiconductor device of the second embodiment. FIG. 23 is a diagram showing a first face of a silicon carbide layer 10. FIG. 22 shows a cross section taken along the line EE' of FIG. 23.

Figure 24:
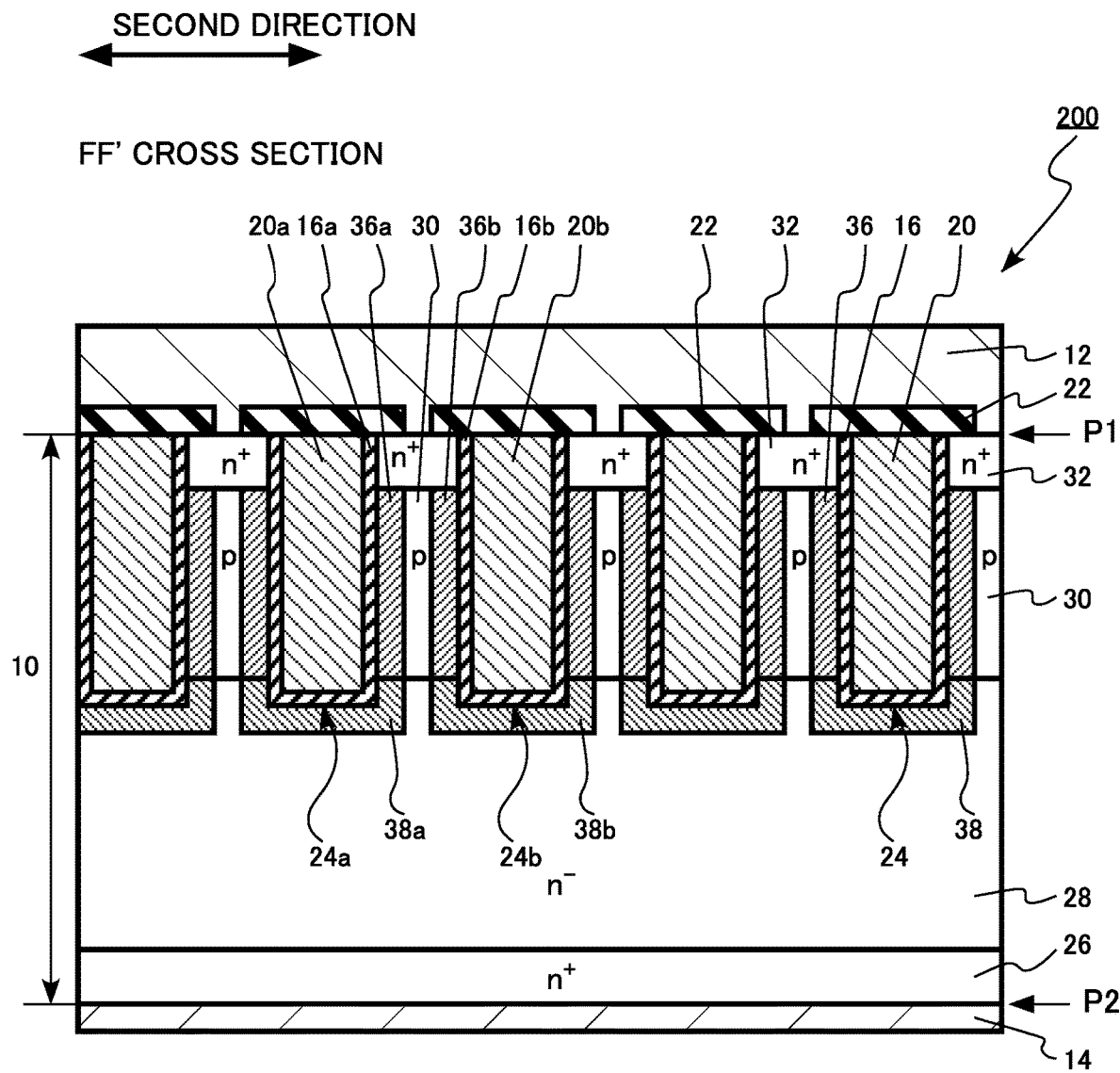
FIG. 24 is a schematic cross-sectional view of the semiconductor device of the second embodiment.
Figure 25:
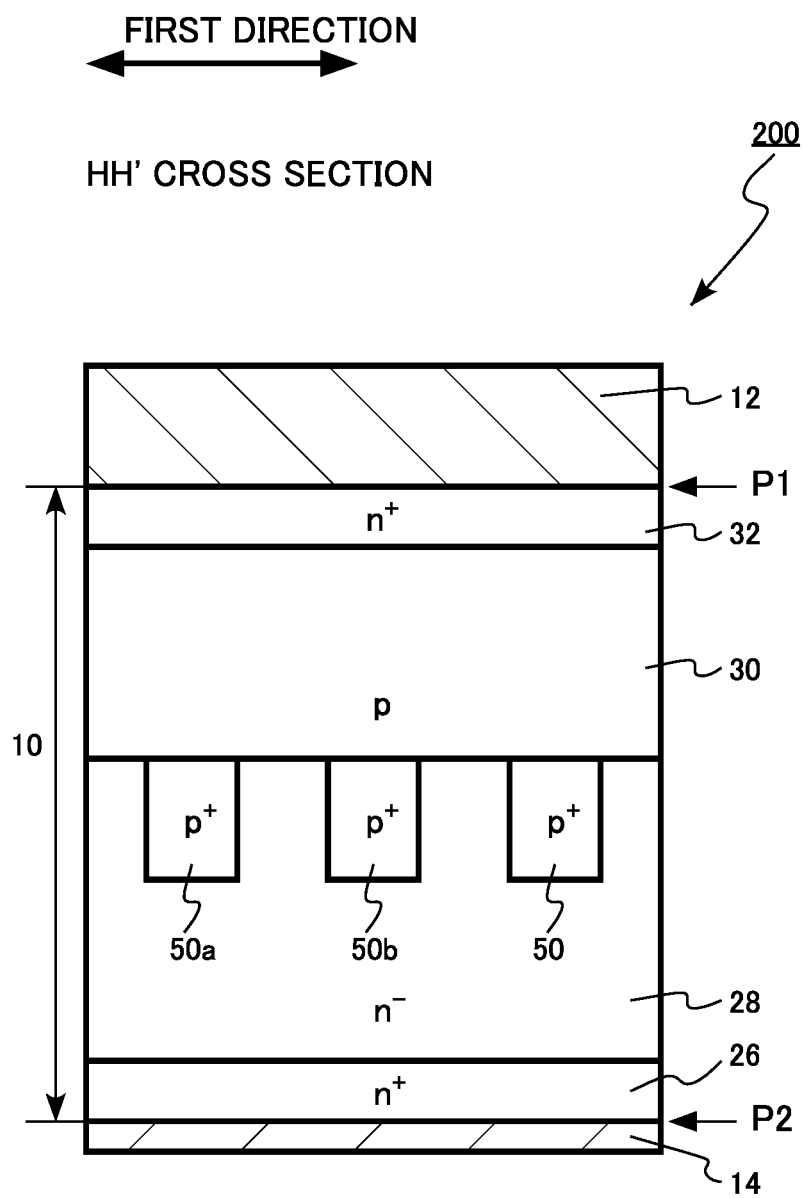
FIG. 25 is a schematic cross-sectional view of the semiconductor device of the second embodiment.

FIGS. 24 and 25 are schematic cross-sectional views of the semiconductor device of the second embodiment. FIG. 24 shows a cross section taken along the line FF' of FIG. 23. FIG. 25 shows a cross section taken along the HH' of FIG. 23.

The MOSFET 200 includes the silicon carbide layer 10, a source electrode 12 (first electrode), a drain electrode 14 (second electrode), a gate insulating layer 16, a gate electrode 20, and an interlayer insulating layer 22. The source electrode 12 is an example of the first electrode. The drain electrode 14 is an example of the second electrode.

The gate insulating layer 16 includes a first gate insulating layer 16*a* and a second gate insulating layer 16*b*. The gate electrode 20 includes a first gate electrode 20*a* and a second gate electrode 20*b*.

The silicon carbide layer 10 includes a trench 24, a drain region 26, a drift region 28 (first silicon carbide region), a p-well region 30 (second silicon carbide region), a source region 32 (third silicon carbide region), a side surface oxygen region 36, a bottom surface oxygen region 38, and a p-stripe region 50.

The trench 24 includes a first trench 24*a* and a second trench 24*b*. The side surface oxygen region 36 includes a first side surface oxygen region 36*a* (fourth silicon carbide region) and a second side surface oxygen region 36*b* (fifth silicon carbide region). The bottom surface oxygen region 38 includes a first bottom surface oxygen region 38*a* (sixth silicon carbide region) and a second bottom surface oxygen region 38*b* (seventh silicon carbide region). The p-stripe region 50 includes a first p-stripe region 50*a* (tenth silicon carbide region) and a second p-stripe region 50*b* (eleventh silicon carbide region).

The drift region 28 is an example of the first silicon carbide region. The p-well region 30 is an example of the second silicon carbide region. The source region 32 is an example of the third silicon carbide region. The p-bottom region 40 is an example of the ninth silicon carbide region. The first side surface oxygen region 36*a* is an example of the fourth silicon carbide region. The second side surface oxygen region 36*b* is an example of the fifth silicon carbide region. The first bottom surface oxygen region 38*a* is an example of the sixth silicon carbide region. The second bottom surface oxygen region 38*b* is an example of the seventh silicon carbide region. The first p-stripe region 50a is an example of the tenth silicon carbide region. The second p-stripe region 50b is an example of the eleventh silicon carbide region.

The source region 32 is an n$^+$-type SiC. The source region 32 is disposed between the p-well region 30 and the first face P1. The source region 32 is in contact with the first face P1. The source region 32 is provided between the trench 24 and the trench 24. The source region 32 extends in the first direction. The source region 32 is electrically connected to the source electrode 12.

The p-stripe region 50 is a p$^+$-type SiC. The p-stripe region 50 is provided between the trench 24 and the drift region 28. The p-stripe region 50 is provided between the p-well region 30 and the drift region 28. The p-stripe region 50 is in contact with the p-well region 30. The p-stripe region 50 extends in the second direction. The p-stripe region 50 is repeatedly arranged in the first direction.

The first p-stripe region 50a is a p$^-$-type SiC. The first p-stripe region 50a is provided between the first trench 24a and the drift region 28. The first p-stripe region 50a is provided between the second trench 24b and the drift region 28. The first p-stripe region 50a is provided between the p-well region 30 and the drift region 28. The first p-stripe region 50a is in contact with the p-well region 30. The first p-stripe region 50a extends in the second direction.

The second p-stripe region 50b is a p$^+$-type SiC. The second p-stripe region 50b is provided between the first trench 24a and the drift region 28. The second p-stripe region 50b is provided between the second trench 24b and the drift region 28. The second p-stripe region 50b is provided between the p-well region 30 and the drift region 28. The second p-stripe region 50b is in contact with the p-well region 30. The second p-stripe region 50b extends in the second direction. The second p-stripe region 50b is separated from the first p-stripe region 50a in the first direction. The second p-stripe region 50b is adjacent to the first p-stripe region 50a in the first direction.

The p-stripe region 50 is electrically connected to the source electrode 12 in a region that is not shown. The p-well region 30 is electrically connected to the source electrode 12 through the p-stripe region 50.

The p-stripe region 50 is provided between the bottom surface oxygen region 38 and the drift region 28.

The p-stripe region 50 contains, for example, aluminum (Al) as a p-type impurity. The p-type impurity concentration in the p-stripe region 50 is, for example, equal to or more than $1\times10^{18}$ cm$^{-3}$ and equal to or less than $1\times10^{22}$ cm$^{-3}$. The p-type impurity concentration in the p-stripe region 50 is higher than the p-type impurity concentration in the p-well region 30.

The MOSFET 200 of the second embodiment includes the p-stripe region 50 at the bottom of the trench 24 in a direction perpendicular to the trench 24. In the MOSFET 200, when a high voltage is applied to the drain electrode 14, the current path between the trench 24 and the trench 24 is blocked by a depletion layer extending from the p-stripe region 50 to the drift region 28. Therefore, it is possible to increase the short-circuit tolerance of the MOSFET 200.

By adjusting the distance between the p-stripe region 50 and the p-stripe region 50 adjacent to each other, it is possible to adjust the short-circuit tolerance and the on-resistance.

As described above, according to the semiconductor device of the second embodiment, the MOSFET having reduced on-resistance is provided as in the first embodiment.

Third Embodiment

A semiconductor device of a third embodiment is different from the semiconductor device of the first embodiment in that the semiconductor device of the third embodiment further includes: a first region provided between the first gate insulating layer and the fourth silicon carbide region and containing at least one element selected from a group consisting of nitrogen (N), phosphorus (P), arsenic (As), antimony (Sb), bismuth (Bi), scandium (Sc), yttrium (Y), and lanthanoids (La, Ce, Pr, Nd, Pm, Sm, Eu, Gd, Tb, Dy, Ho, Er, Tm, Yb, and Lu); and a second region provided between the second gate insulating layer and the fifth silicon carbide region and containing at least one element selected from a group consisting of nitrogen (N), phosphorus (P), arsenic (As), antimony (Sb), bismuth (Bi), scandium (Sc), yttrium (Y), and lanthanoids (La, Ce, Pr, Nd, Pm, Sm, Eu, Gd, Tb, Dy, Ho, Er, Tm, Yb, and Lu). Hereinafter, the description of a part of the content overlapping the first embodiment may be omitted.

Figure 26:
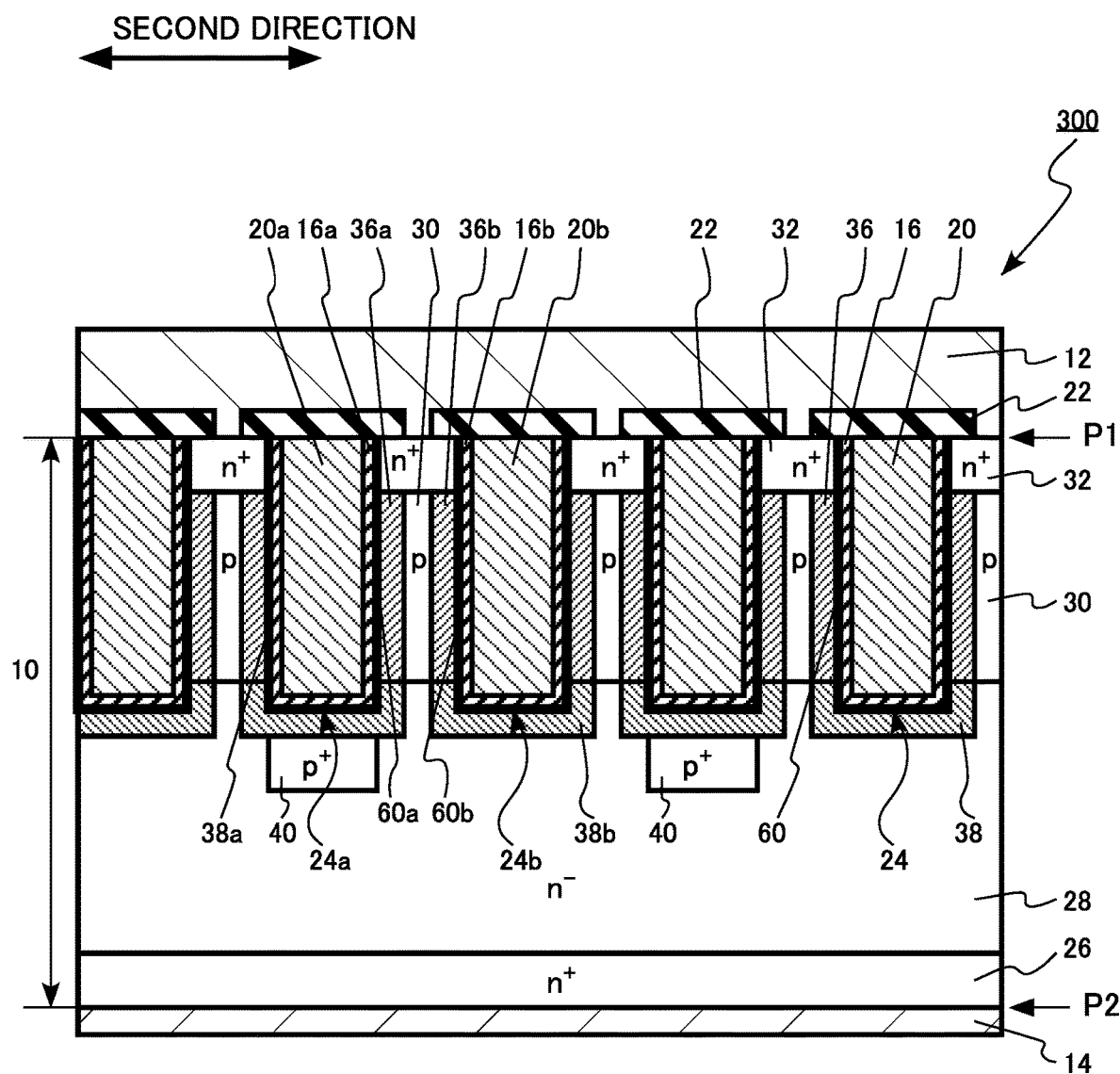
FIG. 26 is a schematic cross-sectional view of a semiconductor device of a third embodiment.

FIG. 26 is a schematic cross-sectional view of the semiconductor device of the third embodiment. The semiconductor device of the third embodiment is a trench gate type vertical MOSFET 300 having a gate electrode in a trench. The MOSFET 300 is an n-channel transistor having electrons as carriers. FIG. 26 is a diagram corresponding to FIG. 1 of the first embodiment.

The MOSFET 300 includes a silicon carbide layer 10, a source electrode 12 (first electrode), a drain electrode 14 (second electrode), a gate insulating layer 16, a gate electrode 20, an interlayer insulating layer 22, and an interface termination region 60. The source electrode 12 is an example of the first electrode. The drain electrode 14 is an example of the second electrode.

The gate insulating layer 16 includes a first gate insulating layer 16a and a second gate insulating layer 16b. The gate electrode 20 includes a first gate electrode 20a and a second gate electrode 20b. The interface termination region 60 includes a first interface termination region 60a (first region) and a second interface termination region 60b (second region).

The silicon carbide layer 10 includes a trench 24, a drain region 26, a drift region 28 (first silicon carbide region), a p-well region 30 (second silicon carbide region), a source region 32 (third silicon carbide region), a p-well contact region 34 (eighth silicon carbide region), a side surface oxygen region 36, a bottom surface oxygen region 38, and a p-bottom region 40 (ninth silicon carbide region).

The trench 24 includes a first trench 24a and a second trench 24b. The side surface oxygen region 36 includes a first side surface oxygen region 36a (fourth silicon carbide region) and a second side surface oxygen region 36b (fifth silicon carbide region). The bottom surface oxygen region 38 includes a first bottom surface oxygen region 38a (sixth silicon carbide region) and a second bottom surface oxygen region 38b (seventh silicon carbide region).

The first interface termination region 60a is an example of the first region. The second interface termination region 60b is an example of the second region. The drift region 28 is an example of the first silicon carbide region. The p-well region 30 is an example of the second silicon carbide region. The source region 32 is an example of the third silicon carbide region. The p-well contact region 34 is an example of the eighth silicon carbide region. The p-bottom region 40 is an example of the ninth silicon carbide region. The first side surface oxygen region 36a is an example of the fourth silicon carbide region. The second side surface oxygen region 36b is an example of the fifth silicon carbide region. The first bottom surface oxygen region 38a is an example of the sixth silicon carbide region. The second bottom surface oxygen region 38b is an example of the seventh silicon carbide region. The p-bottom region 40 is an example of the ninth silicon carbide region.

The interface termination region 60 is provided between the gate insulating layer 16 and the silicon carbide layer 10. The interface termination region 60 is provided between the gate insulating layer 16 and the p-well region 30.

The interface termination region 60 contains at least one termination element selected from the group consisting of nitrogen (N), phosphorus (P), arsenic (As), antimony (Sb), bismuth (Bi), scandium (Sc), yttrium (Y), and lanthanoids (La, Ce, Pr, Nd, Pm, Sm, Eu, Gd, Tb, Dy, Ho, Er, Tm, Yb, and Lu).

The first interface termination region 60a is provided between the first gate insulating layer 16a and the silicon carbide layer 10. The first interface termination region 60a is provided between the first gate insulating layer 16a and the p-well region 30.

The first interface termination region 60a contains at least one termination element selected from the group consisting of nitrogen (N), phosphorus (P), arsenic (As), antimony (Sb), bismuth (Bi), scandium (Sc), yttrium (Y), and lanthanoids (La, Ce, Pr, Nd, Pm, Sm, Eu, Gd, Tb, Dy, Ho, Er, Tm, Yb, and Lu).

The second interface termination region 60b is provided between the second gate insulating layer 16b and the silicon carbide layer 10. The second interface termination region 60b is provided between the second gate insulating layer 16b and the p-well region 30.

The second interface termination region 60b contains at least one termination element selected from the group consisting of nitrogen (N), phosphorus (P), arsenic (As), antimony (Sb), bismuth (Bi), scandium (Sc), yttrium (Y), and lanthanoids (La, Ce, Pr, Nd, Pm, Sm, Eu, Gd, Tb, Dy, Ho, Er, Tm, Yb, and Lu).

When a MOSFET is formed using silicon carbide, it is considered that one factor of the decrease in mobility of electrons is the interface state present at the interface between the silicon carbide layer and the gate insulating layer. It is considered that the mobility of electrons is reduced by trapping or scattering of electrons due to the interface state.

The interface state between the silicon carbide layer and the gate insulating layer is considered to be caused by dangling bonds of silicon atoms or carbon atoms in the uppermost layer of the silicon carbide layer.

In the MOSFET 300 of the third embodiment, the interface termination region 60 is provided between the gate insulating layer 16 and the p-well region 30. Dangling bonds are reduced by the termination elements contained in the interface termination region 60. Therefore, the amount of the interface state between the silicon carbide layer 10 and the gate insulating layer 16 is reduced. As a result, the mobility of the MOSFET 300 is increased, and the on-resistance of the MOSFET 300 is further reduced.

As described above, according to the semiconductor device of the third embodiment, the MOSFET having reduced on-resistance is provided as in the first embodiment.

Fourth Embodiment

A semiconductor device of a fourth embodiment is different from the semiconductor device of the first embodiment in that the semiconductor device of the fourth embodiment further includes: a first gate electrode pad provided on the side of the first face of the silicon carbide layer and electrically connected to the first gate electrode; and a second gate electrode pad provided on the side of the first face of the silicon carbide layer and electrically connected to the second gate electrode. Hereinafter, the description of a part of the content overlapping the first embodiment may be omitted.

Figure 27:
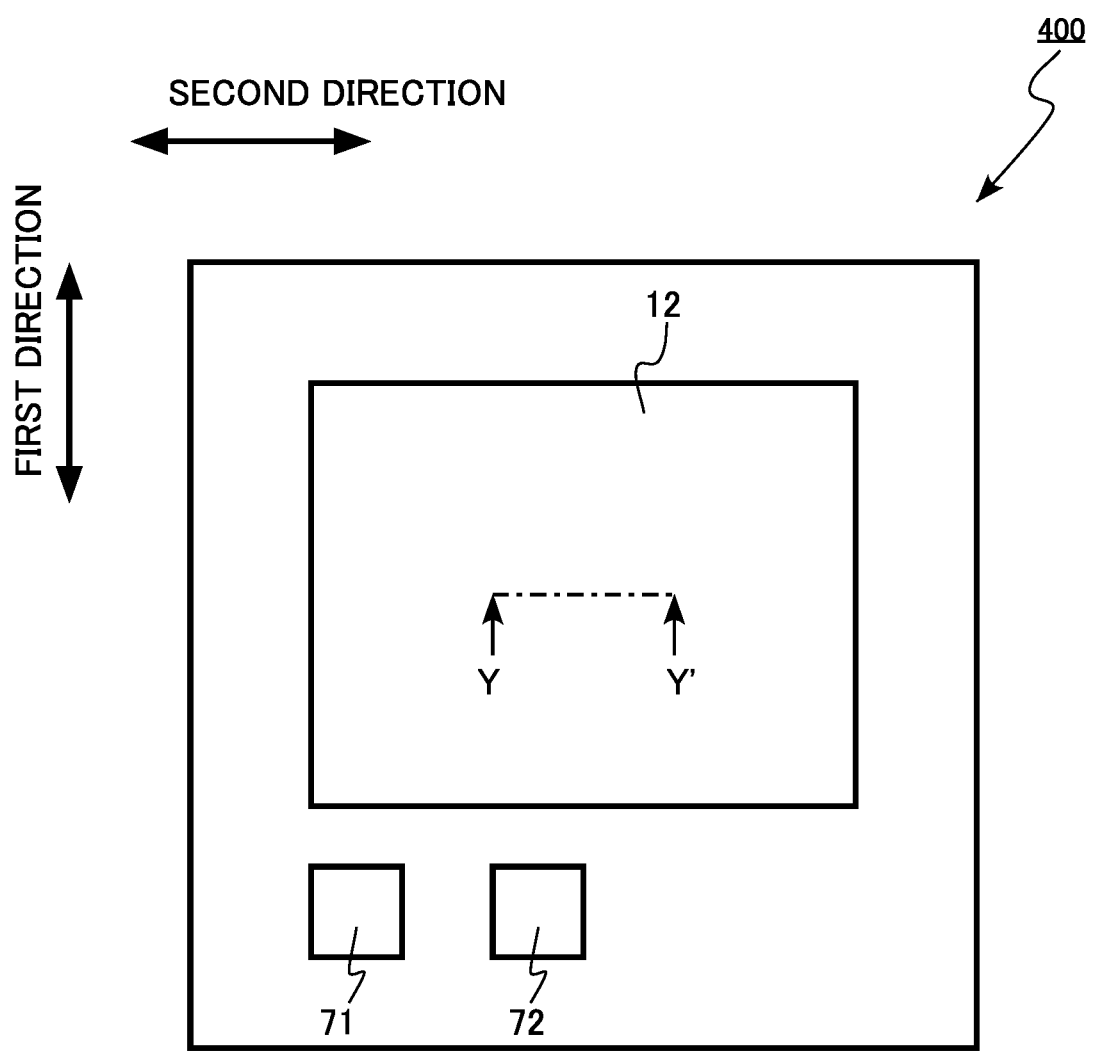
FIG. 27 is a schematic top view of a semiconductor device of a fourth embodiment.

FIG. 27 is a schematic top view of the semiconductor device of the fourth embodiment. FIG. 27 is a chip layout diagram of a MOSFET 400 of the fourth embodiment. FIG. 27 is a view seen from the first face P1 side of the MOSFET 400.

Figure 28:
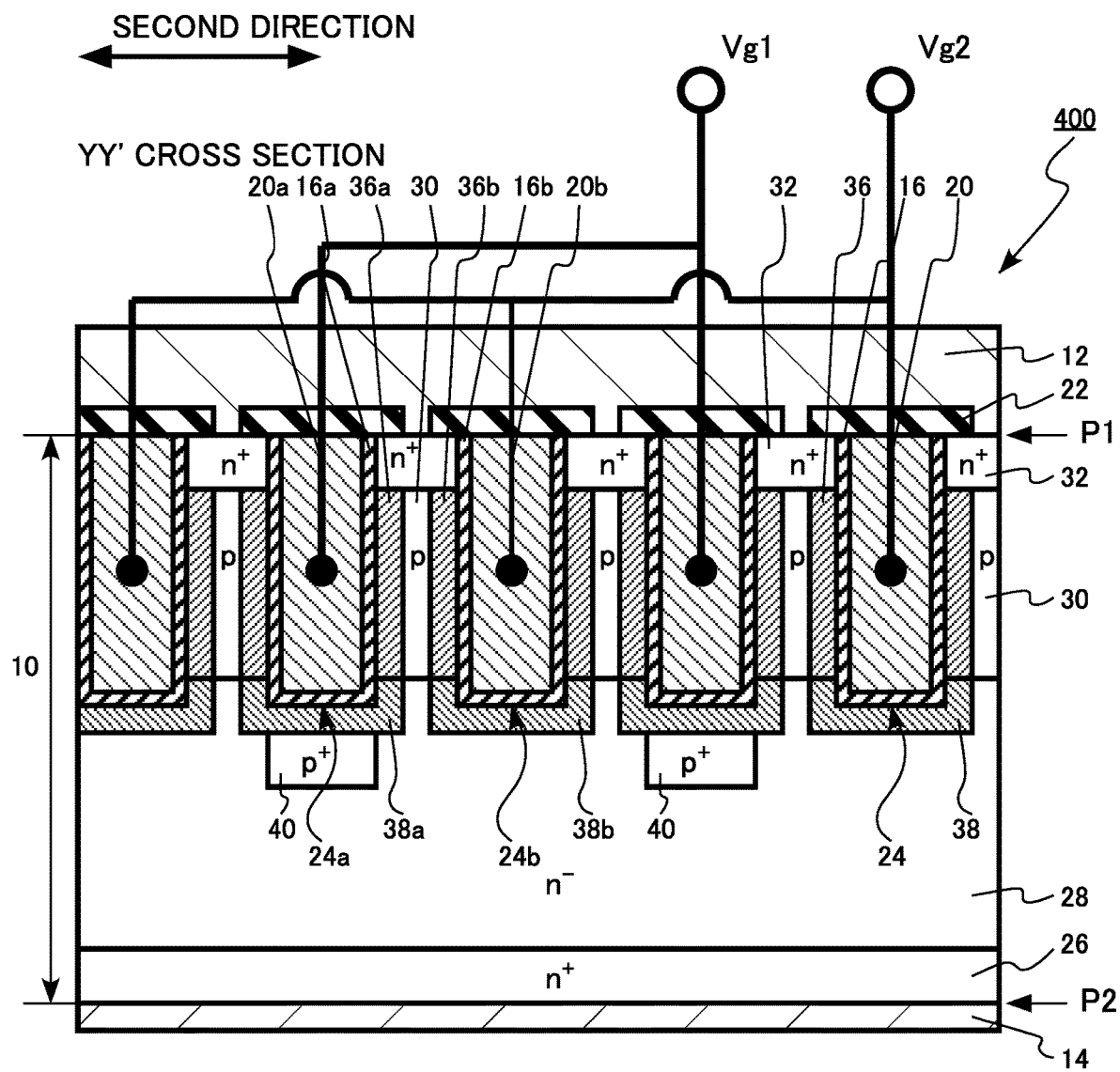
FIG. 28 is a schematic cross-sectional view of the semiconductor device of the fourth embodiment.

FIG. 28 is a schematic cross-sectional view of the semiconductor device of the fourth embodiment. The semiconductor device of the fourth embodiment is a trench gate type vertical MOSFET 400 having a gate electrode in a trench. The MOSFET 400 is an n-channel transistor having electrons as carriers. FIG. 28 shows a cross section taken along the line YY' of FIG. 27. FIG. 28 is a diagram corresponding to FIG. 1 of the first embodiment.

The MOSFET 400 includes a silicon carbide layer 10, a source electrode 12 (first electrode), a drain electrode 14 (second electrode), a gate insulating layer 16, a gate electrode 20, an interlayer insulating layer 22, a first gate electrode pad 71, and a second gate electrode pad 72. The source electrode 12 is an example of the first electrode. The drain electrode 14 is an example of the second electrode.

The gate insulating layer 16 includes a first gate insulating layer 16a and a second gate insulating layer 16b. The gate electrode 20 includes a first gate electrode 20a and a second gate electrode 20b.

The silicon carbide layer 10 includes a trench 24, a drain region 26, a drift region 28 (first silicon carbide region), a p-well region 30 (second silicon carbide region), a source region 32 (third silicon carbide region), a p-well contact region 34 (eighth silicon carbide region), a side surface oxygen region 36, a bottom surface oxygen region 38, and a p-bottom region 40 (ninth silicon carbide region).

The trench 24 includes a first trench 24a and a second trench 24b. The side surface oxygen region 36 includes a first side surface oxygen region 36a (fourth silicon carbide region) and a second side surface oxygen region 36b (fifth silicon carbide region). The bottom surface oxygen region 38 includes a first bottom surface oxygen region 38a (sixth silicon carbide region) and a second bottom surface oxygen region 38b (seventh silicon carbide region).

The drift region 28 is an example of the first silicon carbide region. The p-well region 30 is an example of the second silicon carbide region. The source region 32 is an example of the third silicon carbide region. The p-well contact region 34 is an example of the eighth silicon carbide region. The p-bottom region 40 is an example of the ninth silicon carbide region. The first side surface oxygen region 36a is an example of the fourth silicon carbide region. The second side surface oxygen region 36b is an example of the fifth silicon carbide region. The first bottom surface oxygen region 38a is an example of the sixth silicon carbide region. The second bottom surface oxygen region 38b is an example of the seventh silicon carbide region. The p-bottom region 40 is an example of the ninth silicon carbide region.

The first gate electrode pad 71 is provided on the first face P1 side of the silicon carbide layer 10. The first gate electrode pad 71 is electrically connected to the first gate electrode 20a. The first gate electrode pad 71 is connected to the first gate electrode 20a by a wiring (not shown).

A first gate voltage (Vg1) is applied to the first gate electrode pad 71. By applying the first gate voltage (Vg1) to the first gate electrode pad 71, the first gate voltage (Vg1) can be applied to the first gate electrode 20a.

The second gate electrode pad 72 is provided on the first face P1 side of the silicon carbide layer 10. The second gate electrode pad 72 is electrically connected to the second gate electrode 20b. The second gate electrode pad 72 is connected to the second gate electrode 20b by a wiring (not shown).

A second gate voltage (Vg2) is applied to the second gate electrode pad 72. By applying the second gate voltage (Vg2) to the second gate electrode pad 72, the second gate voltage (Vg2) can be applied to the second gate electrode 20b.

Since the MOSFET 400 includes the first gate electrode pad 71 and the second gate electrode pad 72, different gate voltages can be applied to the first gate electrode 20a and the second gate electrode 20b adjacent to the first gate electrode 20a at different timings. The MOSFET 400 realizes so-called double gate drive.

The characteristics of the MOSFET 400 can be improved by performing double gate drive. For example, the threshold voltage of the MOSFET 400 can be increased by applying a negative bias to the second gate electrode 20b during the OFF operation of the MOSFET 400.

As described above, according to the semiconductor device of the fourth embodiment, the MOSFET having reduced on-resistance is provided as in the first embodiment.

Fifth Embodiment

An inverter circuit and a drive device of a fifth embodiment are drive devices including the semiconductor device of the first embodiment.

Figure 29:
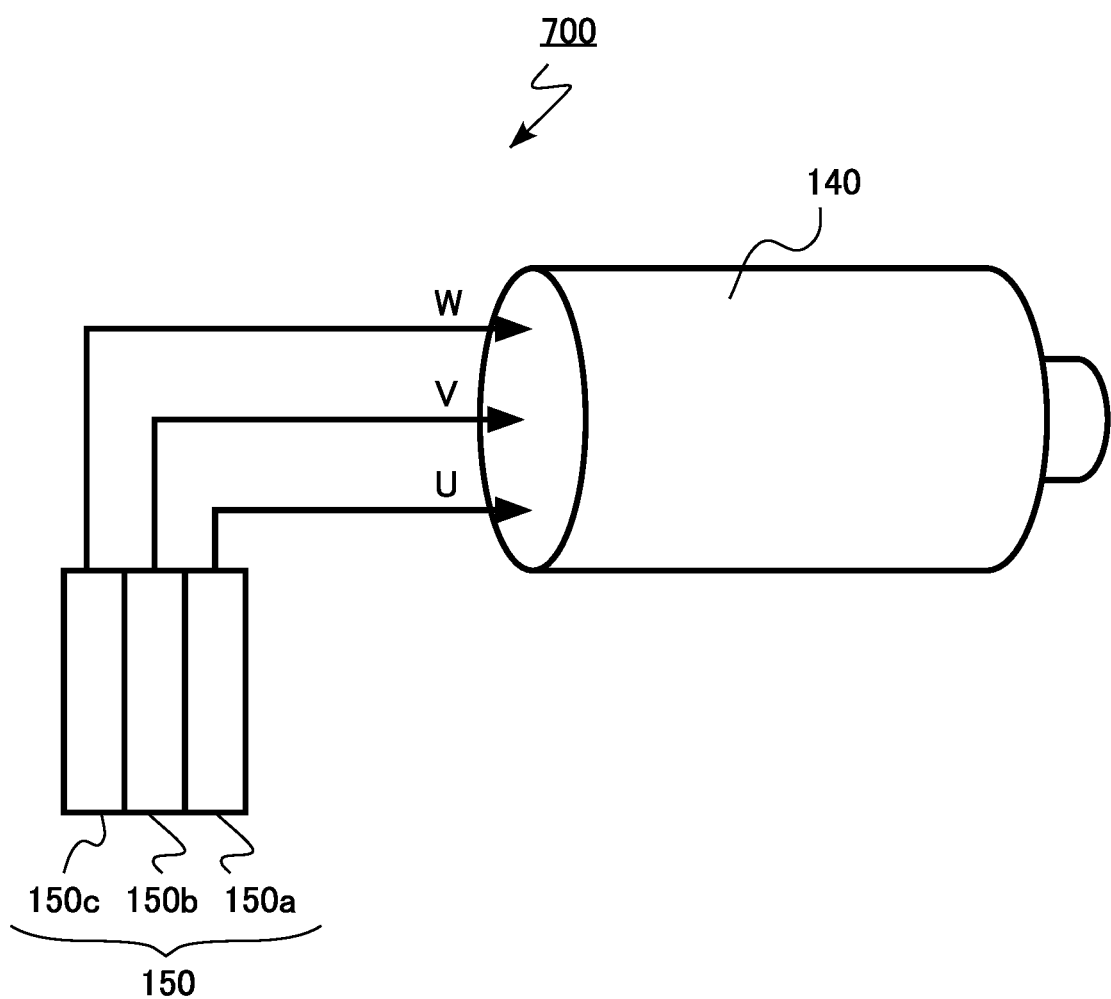
FIG. 29 is a schematic diagram of a drive device of a fifth embodiment.

FIG. 29 is a schematic diagram of the drive device of the fifth embodiment. A drive device 700 includes a motor 140 and an inverter circuit 150.

The inverter circuit 150 includes three semiconductor modules 150a, 150b, and 150c having the MOSFET 100 of the first embodiment as a switching element. By connecting the three semiconductor modules 150a, 150b, and 150c in parallel to each other, a three-phase inverter circuit 150 having three AC voltage output terminals U, V, and W is realized. The motor 140 is driven by the AC voltage output from the inverter circuit 150.

According to the fifth embodiment, the characteristics of the inverter circuit 150 and the drive device 700 are improved by providing the MOSFET 100 with improved characteristics.

Sixth Embodiment

A vehicle of a sixth embodiment is a vehicle including the semiconductor device of the first embodiment.

Figure 30:
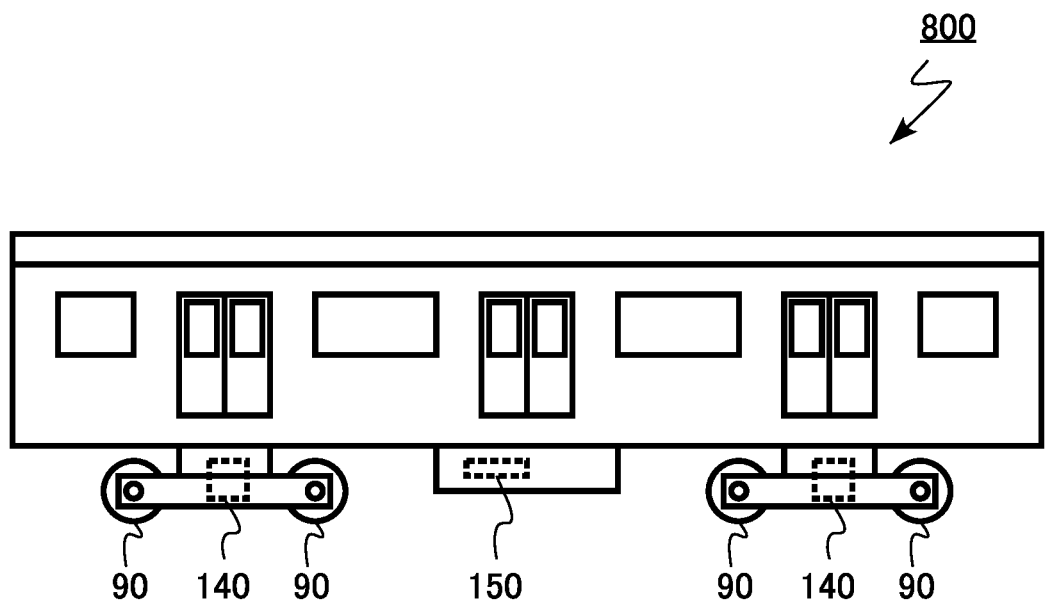
FIG. 30 is a schematic diagram of a vehicle of a sixth embodiment.

FIG. 30 is a schematic diagram of the vehicle of the sixth embodiment. A vehicle 800 of the sixth embodiment is a railroad vehicle. The vehicle 800 includes a motor 140 and an inverter circuit 150.

The inverter circuit 150 includes three semiconductor modules having the MOSFET 100 of the first embodiment as a switching element. By connecting the three semiconductor modules in parallel to each other, a three-phase inverter circuit 150 having three AC voltage output terminals U, V, and W is realized. The motor 140 is driven by the AC voltage output from the inverter circuit 150. The motor 140 rotates wheels 90 of the vehicle 800.

According to the sixth embodiment, the characteristics of the vehicle 800 are improved by providing the MOSFET 100 with improved characteristics.

Seventh Embodiment

A vehicle of a seventh embodiment is a vehicle including the semiconductor device of the first embodiment.

Figure 31:
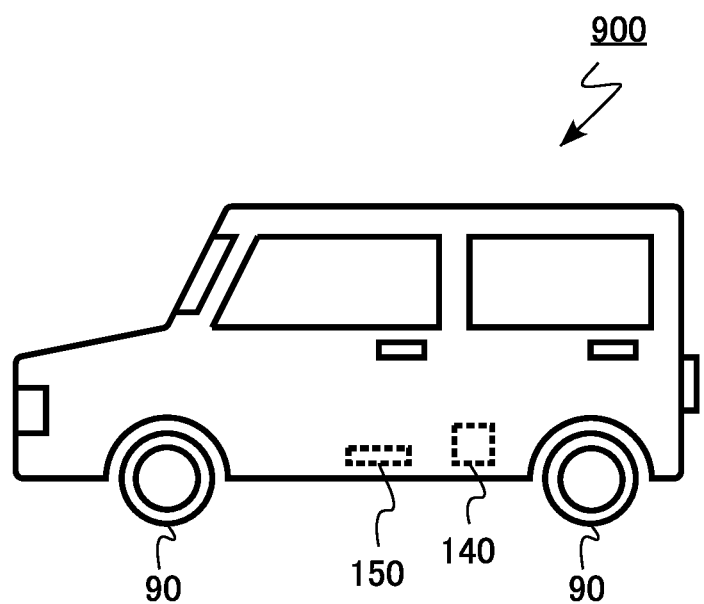
FIG. 31 is a schematic diagram of a vehicle of a seventh embodiment.

FIG. 31 is a schematic diagram of the vehicle of the seventh embodiment. A vehicle 900 of the seventh embodiment is an automobile. The vehicle 900 includes a motor 140 and an inverter circuit 150.

The inverter circuit 150 includes three semiconductor modules having the MOSFET 100 of the first embodiment as a switching element. By connecting the three semiconductor modules in parallel to each other, a three-phase inverter circuit 150 having three AC voltage output terminals U, V, and W is realized.

The motor 140 is driven by the AC voltage output from the inverter circuit 150. The motor 140 rotates wheels 90 of the vehicle 900.

According to the seventh embodiment, the characteristics of the vehicle 900 are improved by providing the MOSFET 100 with improved characteristics.

Eighth Embodiment

An elevator of an eighth embodiment is an elevator including the semiconductor device of the first embodiment.

Figure 32:
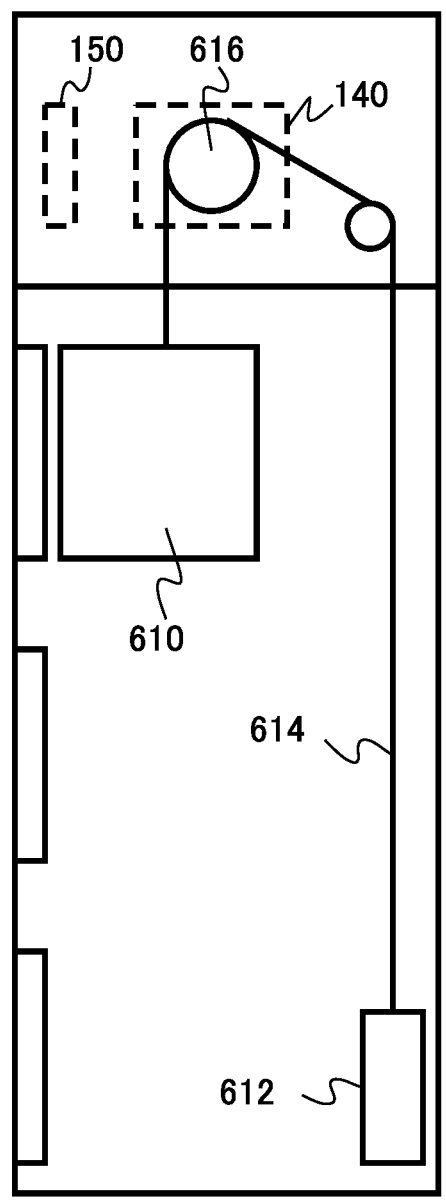
FIG. 32 is a schematic diagram of an elevator of an eighth embodiment.

FIG. 32 is a schematic diagram of the elevator of the eighth embodiment. An elevator 1000 of the eighth embodiment includes a car 610, a counterweight 612, a wire rope 614, a hoisting machine 616, a motor 140, and an inverter circuit 150.

The inverter circuit 150 includes three semiconductor modules having the MOSFET 100 of the first embodiment as a switching element. By connecting the three semiconductor modules in parallel to each other, a three-phase inverter circuit 150 having three AC voltage output terminals U, V, and W is realized.

The motor 140 is driven by the AC voltage output from the inverter circuit 150. The hoisting machine 616 is rotated by the motor 140, and the car 610 is moved up and down.

According to the eighth embodiment, the characteristics of the elevator 1000 are improved by providing the MOSFET 100 with improved characteristics.

As described above, in the first to fourth embodiments, the case of 4H—SiC has been described as an example of the crystal structure of silicon carbide. However, the embodiments can also be applied to silicon carbide having a crystal structure of 3C—SiC or 6H—SiC.

In addition, the embodiments can also be applied to an n-channel insulated gate bipolar transistor (IGBT).

In the first to fourth embodiments, a case where the bottom surface oxygen region 38 is provided has been described as an example. However, it is also possible to adopt a configuration in which the bottom surface oxygen region 38 is not provided. In addition, in the first to fourth embodiments, a case where either the p-bottom region 40 or the p-stripe region 50 is provided has been described as an example. However, it is also possible to adopt a configuration in which neither the p-bottom region 40 nor the p-stripe region 50 is provided. To stabilize a potential of the p-well region 30, it is preferable to have at least one of the p-well contact region 34 and the p-stripe region 50.

In addition, in the fifth to eighth embodiments, the cases where the semiconductor devices of the embodiments are applied to a vehicle or an elevator have been described as examples, but the semiconductor devices of the embodiments can also be applied to, for example, a power conditioner of a photovoltaic power generation system.

In addition, in the fifth to eighth embodiments, a case where the semiconductor device of the first embodiment is applied has been described as an example. However, for example, the semiconductor devices of the second to fourth embodiments can also be applied.

While certain embodiments have been described, these embodiments have been presented by way of example only, and are not intended to limit the scope of the inventions. Indeed, the semiconductor device, the inverter circuit, the drive device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
a silicon carbide layer having a first face and a second face opposite to the first face and including:
 a first trench provided on a side of the first face and extending in a first direction parallel to the first face;
 a second trench provided on the side of the first face, extending in the first direction, and having a distance of 100 nm or less from the first trench in a second direction parallel to the first face and perpendicular to the first direction;
 a first silicon carbide region of n-type;
 a second silicon carbide region of p-type provided between the first silicon carbide region and the first face and provided between the first trench and the second trench;
 a third silicon carbide region of n-type provided between the second silicon carbide region and the first face and provided between the first trench and the second trench;
 a fourth silicon carbide region provided between the first trench and the second silicon carbide region and containing oxygen; and
 a fifth silicon carbide region provided between the second trench and the second silicon carbide region and containing oxygen;
a first gate electrode provided in the first trench;
a second gate electrode provided in the second trench;
a first gate insulating layer provided between the first gate electrode and the silicon carbide layer;
a second gate insulating layer provided between the second gate electrode and the silicon carbide layer;
a first electrode provided on the side of the first face of the silicon carbide layer and electrically connected to the third silicon carbide region; and
a second electrode provided on a side of the second face of the silicon carbide layer,
wherein the fourth silicon carbide region contains an oxygen atom bonded to four silicon atoms, and
the fifth silicon carbide region contains an oxygen atom bonded to four silicon atoms.

2. The semiconductor device according to claim 1, wherein the silicon carbide layer further includes:
a sixth silicon carbide region provided between the first trench and the first silicon carbide region and containing oxygen; and
a seventh silicon carbide region provided between the second trench and the first silicon carbide region and containing oxygen.

3. The semiconductor device according to claim 1, wherein an oxygen concentration in the fourth silicon carbide region is equal to or more than $1\times10^{17}$ cm$^{-3}$ and equal to or less than $1\times10^{23}$ cm$^{-3}$, and an oxygen concentration in the fifth silicon carbide region is equal to or more than $1\times10^{17}$ cm$^{-3}$ and equal to or less than $1\times10^{23}$ cm$^{-3}$.

4. The semiconductor device according to claim 1, wherein a concentration of oxygen atoms bonded to four silicon atoms in the fourth silicon carbide region is higher than a concentration of oxygen atoms bonded to two silicon atoms in the fourth silicon carbide region, and
a concentration of oxygen atoms bonded to four silicon atoms in the fifth silicon carbide region is higher than a concentration of oxygen atoms bonded to two silicon atoms in the fifth silicon carbide region.

5. The semiconductor device according to claim 1, wherein a concentration of oxygen atoms bonded to four silicon atoms in the fourth silicon carbide region is higher than a concentration of oxygen atoms bonded to a carbon atom in the fourth silicon carbide region, and
a concentration of oxygen atoms bonded to four silicon atoms in the fifth silicon carbide region is higher than a concentration of oxygen atoms bonded to a carbon atom in the fifth silicon carbide region.

6. The semiconductor device according to claim 1, wherein the fourth silicon carbide region is p-type, and the fifth silicon carbide region is p-type.

7. The semiconductor device according to claim 1, wherein a width of the first trench in the second direction is larger than a distance between the first trench and the second trench in the second direction.

8. The semiconductor device according to claim 1, further comprising:
a first gate electrode pad provided on the side of the first face of the silicon carbide layer and electrically connected to the first gate electrode; and
a second gate electrode pad provided on the side of the first face of the silicon carbide layer and electrically connected to the second gate electrode.

9. An inverter circuit comprising the semiconductor device according to claim 1.

10. A drive device comprising the semiconductor device according to claim 1.

11. A vehicle comprising the semiconductor device according to claim 1.

12. An elevator comprising the semiconductor device according to claim 1.

13. A semiconductor device, comprising:
a silicon carbide layer having a first face and a second face opposite to the first face and including:
 a first trench provided on a side of the first face and extending in a first direction parallel to the first face;
 a second trench provided on the side of the first face, extending in the first direction, and having a distance of 100 nm or less from the first trench in a second direction parallel to the first face and perpendicular to the first direction;
 a first silicon carbide region of n-type;
 a second silicon carbide region of p-type provided between the first silicon carbide region and the first face and provided between the first trench and the second trench;

a third silicon carbide region of n-type provided between the second silicon carbide region and the first face and provided between the first trench and the second trench;
a fourth silicon carbide region provided between the first trench and the second silicon carbide region and containing oxygen; and
a fifth silicon carbide region provided between the second trench and the second silicon carbide region and containing oxygen;
a first gate electrode provided in the first trench;
a second gate electrode provided in the second trench;
a first gate insulating layer provided between the first gate electrode and the silicon carbide layer;
a second gate insulating layer provided between the second gate electrode and the silicon carbide layer;
a first electrode provided on the side of the first face of the silicon carbide layer and electrically connected to the third silicon carbide region; and
a second electrode provided on a side of the second face of the silicon carbide layer,
wherein an oxygen concentration at a first position 20 nm away from an interface between the first gate insulating layer and the silicon carbide layer toward the silicon carbide layer is less than $1 \times 10^{17}$ cm$^{-3}$, and
an oxygen concentration at a second position 20 nm away from an interface between the second gate insulating layer and the silicon carbide layer toward the silicon carbide layer is less than $1 \times 10^{17}$ cm$^{-3}$.

14. A semiconductor device, comprising:
a silicon carbide layer having a first face and a second face opposite to the first face and including:
  a first trench provided on a side of the first face and extending in a first direction parallel to the first face;
  a second trench provided on the side of the first face, extending in the first direction, and having a distance of 100 nm or less from the first trench in a second direction parallel to the first face and perpendicular to the first direction;
  a first silicon carbide region of n-type;
  a second silicon carbide region of p-type provided between the first silicon carbide region and the first face and provided between the first trench and the second trench;
  a third silicon carbide region of n-type provided between the second silicon carbide region and the first face and provided between the first trench and the second trench;
  a fourth silicon carbide region provided between the first trench and the second silicon carbide region and containing oxygen; and
  a fifth silicon carbide region provided between the second trench and the second silicon carbide region and containing oxygen;
a first gate electrode provided in the first trench;
a second gate electrode provided in the second trench;
a first gate insulating layer provided between the first gate electrode and the silicon carbide layer;
a second gate insulating layer provided between the second gate electrode and the silicon carbide layer;
a first electrode provided on the side of the first face of the silicon carbide layer and electrically connected to the third silicon carbide region; and
a second electrode provided on a side of the second face of the silicon carbide layer,
wherein the fourth silicon carbide region is p-type, and the fifth silicon carbide region is p-type,
wherein the fourth silicon carbide region contains aluminum, and an oxygen concentration in the fourth silicon carbide region is higher than an aluminum concentration in the fourth silicon carbide region, and
the fifth silicon carbide region contains aluminum, and an oxygen concentration in the fifth silicon carbide region is higher than an aluminum concentration in the fifth silicon carbide region.

15. A semiconductor device, comprising:
a silicon carbide layer having a first face and a second face opposite to the first face and including:
  a first trench provided on a side of the first face and extending in a first direction parallel to the first face;
  a second trench provided on the side of the first face, extending in the first direction, and having a distance of 100 nm or less from the first trench in a second direction parallel to the first face and perpendicular to the first direction;
  a first silicon carbide region of n-type;
  a second silicon carbide region of p-type provided between the first silicon carbide region and the first face and provided between the first trench and the second trench;
  a third silicon carbide region of n-type provided between the second silicon carbide region and the first face and provided between the first trench and the second trench;
  a fourth silicon carbide region provided between the first trench and the second silicon carbide region and containing oxygen; and
  a fifth silicon carbide region provided between the second trench and the second silicon carbide region and containing oxygen;
a first gate electrode provided in the first trench;
a second gate electrode provided in the second trench;
a first gate insulating layer provided between the first gate electrode and the silicon carbide layer;
a second gate insulating layer provided between the second gate electrode and the silicon carbide layer;
a first electrode provided on the side of the first face of the silicon carbide layer and electrically connected to the third silicon carbide region; and
a second electrode provided on a side of the second face of the silicon carbide layer,
wherein the silicon carbide layer further includes an eighth silicon carbide region of p-type provided between the second silicon carbide region and the first face, provided between the first trench and the second trench, disposed in the first direction with respect to the third silicon carbide region, having a p-type impurity concentration higher than a p-type impurity concentration in the second silicon carbide region, and electrically connected to the first electrode.

16. A semiconductor device, comprising:
a silicon carbide layer having a first face and a second face opposite to the first face and including:
  a first trench provided on a side of the first face and extending in a first direction parallel to the first face;
  a second trench provided on the side of the first face, extending in the first direction, and having a distance of 100 nm or less from the first trench in a second direction parallel to the first face and perpendicular to the first direction;
  a first silicon carbide region of n-type;

a second silicon carbide region of p-type provided between the first silicon carbide region and the first face and provided between the first trench and the second trench;
a third silicon carbide region of n-type provided between the second silicon carbide region and the first face and provided between the first trench and the second trench;
a fourth silicon carbide region provided between the first trench and the second silicon carbide region and containing oxygen; and
a fifth silicon carbide region provided between the second trench and the second silicon carbide region and containing oxygen;
a first gate electrode provided in the first trench;
a second gate electrode provided in the second trench;
a first gate insulating layer provided between the first gate electrode and the silicon carbide layer;
a second gate insulating layer provided between the second gate electrode and the silicon carbide layer;
a first electrode provided on the side of the first face of the silicon carbide layer and electrically connected to the third silicon carbide region; and
a second electrode provided on a side of the second face of the silicon carbide layer,
wherein the silicon carbide layer further includes:
a sixth silicon carbide region provided between the first trench and the first silicon carbide region and containing oxygen; and
a seventh silicon carbide region provided between the second trench and the first silicon carbide region and containing oxygen,
wherein the silicon carbide layer further includes a ninth silicon carbide region provided between the first trench and the first silicon carbide region and having a p-type impurity concentration higher than a p-type impurity concentration in the second silicon carbide region, and
the sixth silicon carbide region is p-type, and the seventh silicon carbide region is n-type.

17. A semiconductor device, comprising:
a silicon carbide layer having a first face and a second face opposite to the first face and including:
    a first trench provided on a side of the first face and extending in a first direction parallel to the first face;
    a second trench provided on the side of the first face, extending in the first direction, and having a distance of 100 nm or less from the first trench in a second direction parallel to the first face and perpendicular to the first direction;
    a first silicon carbide region of n-type;
    a second silicon carbide region of p-type provided between the first silicon carbide region and the first face and provided between the first trench and the second trench;
    a third silicon carbide region of n-type provided between the second silicon carbide region and the first face and provided between the first trench and the second trench;
    a fourth silicon carbide region provided between the first trench and the second silicon carbide region and containing oxygen; and
    a fifth silicon carbide region provided between the second trench and the second silicon carbide region and containing oxygen;
a first gate electrode provided in the first trench;
a second gate electrode provided in the second trench;
a first gate insulating layer provided between the first gate electrode and the silicon carbide layer;
a second gate insulating layer provided between the second gate electrode and the silicon carbide layer:
a first electrode provided on the side of the first face of the silicon carbide layer and electrically connected to the third silicon carbide region; and
a second electrode provided on a side of the second face of the silicon carbide layer,
wherein the silicon carbide layer further includes:
a tenth silicon carbide region provided between the first trench and the first silicon carbide region, provided between the second trench and the first silicon carbide region, provided between the second silicon carbide region and the first silicon carbide region, in contact with the second silicon carbide region, and extending in the second direction; and
an eleventh silicon carbide region provided between the first trench and the first silicon carbide region, provided between the second trench and the first silicon carbide region, provided between the second silicon carbide region and the first silicon carbide region, in contact with the second silicon carbide region, extending in the second direction, and separated from the tenth silicon carbide region in the first direction.

18. A semiconductor device, comprising:
a silicon carbide layer having a first face and a second face opposite to the first face and including:
    a first trench provided on a side of the first face and extending in a first direction parallel to the first face;
    a second trench provided on the side of the first face, extending in the first direction, and having a distance of 100 nm or less from the first trench in a second direction parallel to the first face and perpendicular to the first direction;
    a first silicon carbide region of n-type;
    a second silicon carbide region of p-type provided between the first silicon carbide region and the first face and provided between the first trench and the second trench;
    a third silicon carbide region of n-type provided between the second silicon carbide region and the first face and provided between the first trench and the second trench;
    a fourth silicon carbide region provided between the first trench and the second silicon carbide region and containing oxygen; and
    a fifth silicon carbide region provided between the second trench and the second silicon carbide region and containing oxygen;
a first gate electrode provided in the first trench;
a second gate electrode provided in the second trench;
a first gate insulating layer provided between the first gate electrode and the silicon carbide layer;
a second gate insulating layer provided between the second gate electrode and the silicon carbide layer;
a first electrode provided on the side of the first face of the silicon carbide layer and electrically connected to the third silicon carbide region;
a second electrode provided on a side of the second face of the silicon carbide layer,
a first region provided between the first gate insulating layer and the fourth silicon carbide region and containing at least one element selected from a group consisting of nitrogen (N), phosphorus (P), arsenic (As), antimony (Sb), bismuth (Bi), scandium (Sc), yttrium (Y), and lanthanoids (La, Ce, Pr, Nd, Pm, Sm, Eu, Gd, Tb, Dy, Ho, Er, Tm, Yb, and Lu); and a second region provided between the second gate insulating layer and the fifth silicon carbide region and containing at least one element selected from a group consisting of nitrogen (N), phosphorus (P), arsenic (As), antimony (Sb), bismuth (Bi), scandium (Sc), yttrium (Y), and lanthanoids (La, Ce, Pr, Nd, Pm, Sm, Eu, Gd, Tb, Dy, Ho, Er, Tm, Yb, and Lu).

* * * * *